US008860403B2

(12) United States Patent
Walther et al.

(10) Patent No.: US 8,860,403 B2
(45) Date of Patent: Oct. 14, 2014

(54) GRADIENT SENSOR OF A COMPONENT OF A MAGNETIC FIELD WITH PERMANENT MAGNET

(75) Inventors: Arnaud Walther, Grenoble (FR); Robert Cuchet, Monestier de Percy (FR); Jerome Delamare, Grenoble (FR); Aline Msaed, Grenoble (FR); Jean-Baptiste Albertini, Ajaccio (FR)

(73) Assignees: Commissariat a l'energie atomique et aux energies alternatives, Paris (FR); Institut Polytechnique de Grenoble, Grenoble (FR)

( * ) Notice: Subject to any disclaimer, the term of this patent is extended or adjusted under 35 U.S.C. 154(b) by 935 days.

(21) Appl. No.: 12/710,675

(22) Filed: Feb. 23, 2010

(65) Prior Publication Data

US 2010/0295546 A1 Nov. 25, 2010

(30) Foreign Application Priority Data

Mar. 6, 2009 (FR) ...................................... 09 51424

(51) Int. Cl.
| | | |
|---|---|---|
| *G01B 7/14* | (2006.01) | |
| *G01R 33/022* | (2006.01) | |
| *G01R 33/028* | (2006.01) | |

(52) U.S. Cl.
CPC ............ *G01R 33/022* (2013.01); *G01R 33/028* (2013.01); *G01R 33/0286* (2013.01)
USPC ...... 324/207.11; 324/318; 324/200; 324/300; 324/307; 324/309

(58) Field of Classification Search
USPC ........................................................ 324/244
See application file for complete search history.

(56) References Cited

U.S. PATENT DOCUMENTS

| | | | |
|---|---|---|---|
| 3,829,768 A | | 8/1974 | Nicol et al. |
| 4,931,732 A | * | 6/1990 | Moon ........................... 324/228 |

(Continued)

FOREIGN PATENT DOCUMENTS

| | | |
|---|---|---|
| WO | WO 01/67122 A2 | 9/2001 |
| WO | WO 01/67122 A3 | 9/2001 |
| WO | WO 2005/062064 A1 | 7/2005 |

OTHER PUBLICATIONS

Slawomir Tumanski, "Induction coil sensors—a review", Measurement Science and Technology, vol. 18, (Institute of Physics Publishing), 2007, pp. R31-R46.

(Continued)

*Primary Examiner* — Tung X Nguyen
*Assistant Examiner* — Alesa Allgood
(74) *Attorney, Agent, or Firm* — Oblon, Spivak, McClelland, Maier& Neustadt, L.L.P.

(57) ABSTRACT

A gradient sensor of a component of a magnetic field comprising at least one elementary sensor comprising a deformable mass (31) equipped with a permanent magnet (32) having a magnetization direction substantially colinear to the direction of the gradient of the component of the magnetic field to be acquired by the sensor. The deformable mass (31) is able to deform under the effect of a force exerted on the magnet by the gradient, the effect of this force being to shift it, by dragging the deformable mass (31), in a direction substantially colinear to the component of the magnetic field for which the sensor has to acquire the gradient. The deformable mass (31) is anchored to a fixed support device (33) in at least two anchoring points (36) substantially opposite relative to the mass (31). The elementary sensor also comprises measuring means (35, 35.1, 35.2, 35.3) of at least one electric variable translating deformation or stress of the deformable mass (31) engendered by the gradient.

20 Claims, 16 Drawing Sheets

(56) References Cited

U.S. PATENT DOCUMENTS 6,664,786 B2 * 12/2003 Kretschmann et al. ....... 324/259
2003/0020472 A1 1/2003 Kretschmann et al.

OTHER PUBLICATIONS

Alexey V. Veryaskin, "Magnetic gradiometry: a new method for magnetic gradient measurements", Sensors and Actuators A 91, Elsevier, 2001, pp. 233-235.

Haruo Okamura, "Fiber-Optic Magnetic Gradiometer Utilizing the Magnetic Translation Force", Journal of Lightwave Technology, vol. 8, No. 6, Jun. 6, 1990, pp. 877-882.

E. S. Leland, et al., "Desing of a Mems Passive, Proximity-Based AC Electric Current Sensor for Residential and Commercial Loads", Power MEMS, 2007, pp. 77-80.

J. C. Suits, et al., "Thermomagnetic writing in Tb—Fe: Modeling and comparison with experiment", J. Appl. Phys. 64 (1), Jul. 1, 1988, pp. 252-261.

* cited by examiner

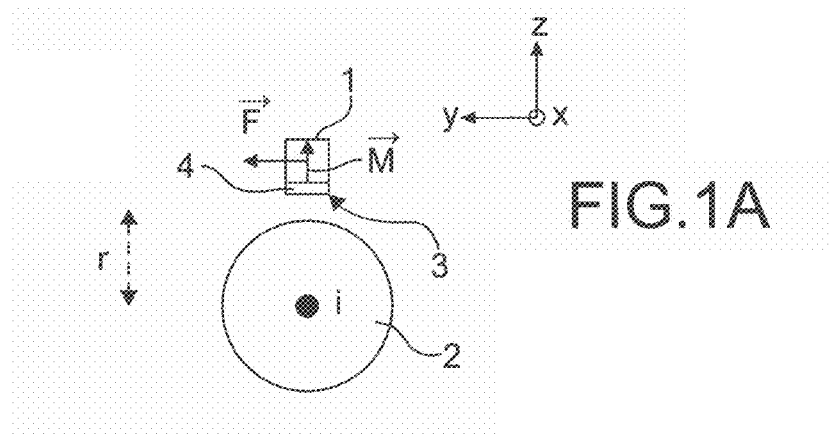
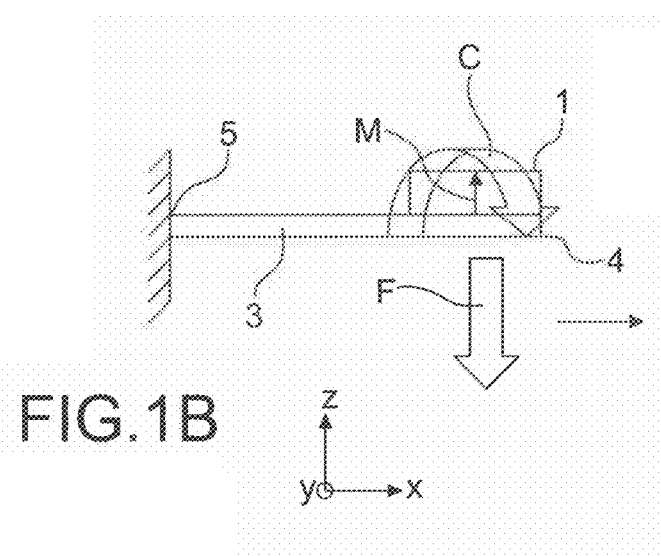
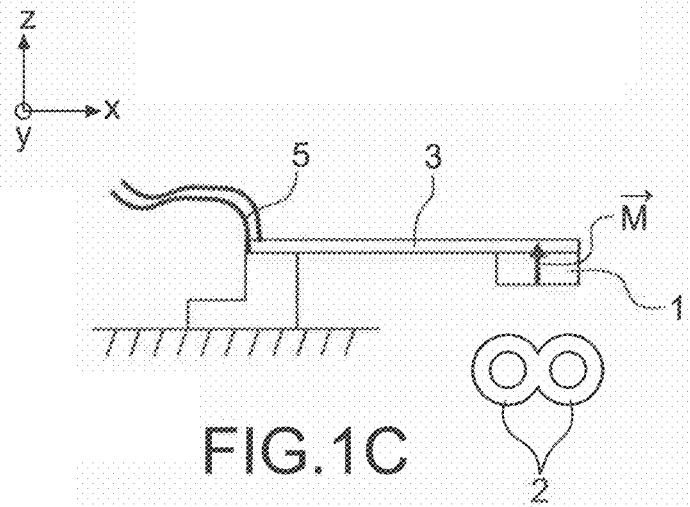

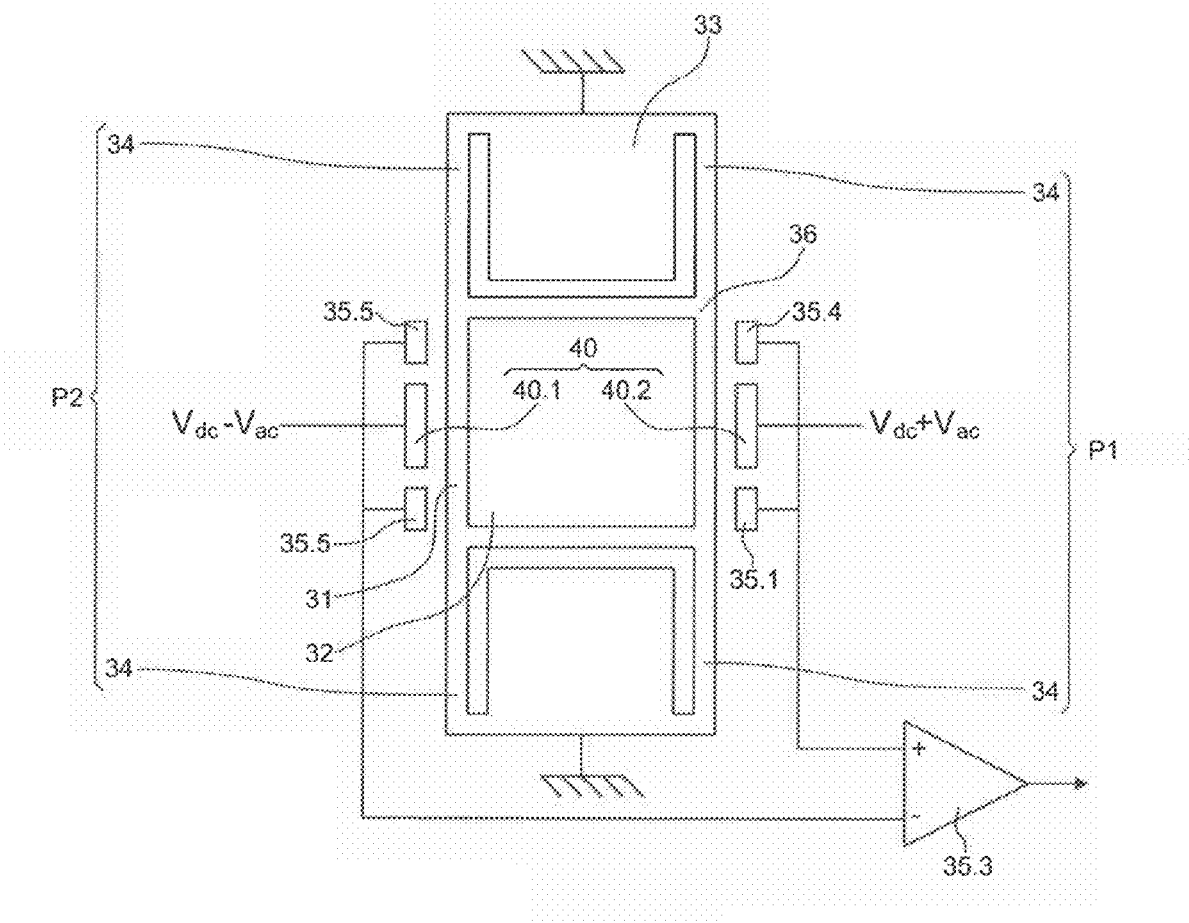

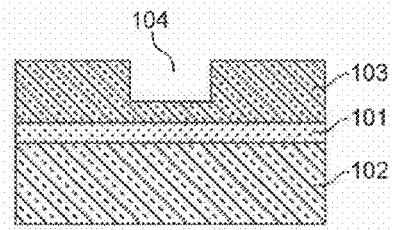
FIG.13A  FIG.13B
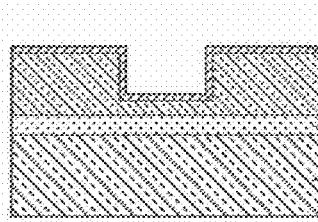
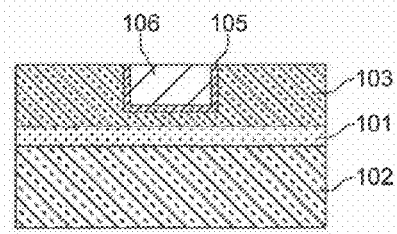
FIG.13C  FIG.13D
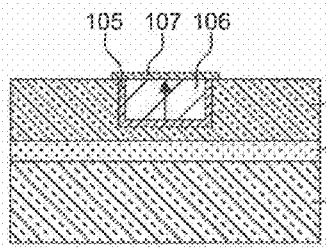
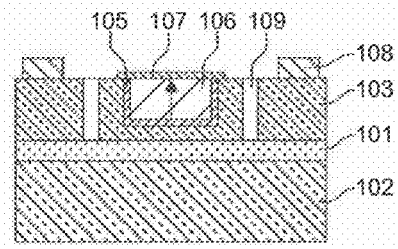
FIG.13E  FIG.13F
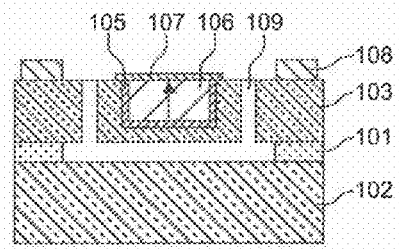
FIG.13G

GRADIENT SENSOR OF A COMPONENT OF A MAGNETIC FIELD WITH PERMANENT MAGNET

TECHNICAL FIELD

The present invention concerns a sensor of the gradient of a component of a magnetic field and a production process of this sensor in integrated technology. With respect to the magnetic field, it can be magnetic excitation H also called current field or magnetic induction B, these two variables being connected in a fixed manner.

Such a sensor can be utilised for taking measurements without contact from current circulating in a filiform conductor. The fields of application of such current measuring are numerous. They can be especially evaluation of electric consumption in buildings, whether industrial or domestic, in terrestrial, maritime or aerial transport means. Another field is for example the protective function by tripping circuit breakers of electrical installations in the same environments. It can also be employed to ensure protection of electric motors, the costly copper windings of which must not be penetrated by excessive electric currents which deteriorate insulators and cause short-circuits. More possible uses are, for example, detection and positioning of buried electric cables or measuring currents induced in non-destructive control or materials research.

It is understood that in other applications measuring the gradient of a component of a magnetic field can be used as such without employing current circulation.

PRIOR ART

The gradient of a component of a magnetic field can be measured by means of two sensors, for example pairs of detection bobbins as in patent [1] for which complete references are found at the end of the description, each placed in one position, both sensors being very close. Each of the sensors measures the component of the magnetic field and the difference between the two measurements relates back to the gradient of the magnetic field. But the presence of the magnetic circuit of one of the sensors can perturb the measuring of the other sensor and vice versa. Also, precision of the gradient measuring is limited by precision of the two sensors, by precision of the knowledge of their positions and by the reproducibility of the properties of each of the sensors taken individually.

In other devices, only a single magnetic field sensor is used, as in document [2]. This sensor is shifted according to the direction of the gradient. The variation in signal delivered by the sensor as a function of its position relates back to the gradient of the magnetic field. This document eliminates the disadvantages associated with the presence of both sensors but precise measuring of the position is always required, which limits the sensitivity of the measuring of the gradient.

In document [3], only a single sensor is used and this sensor is directly sensitive to the gradient of a magnetic field. The advantage of using a gradient sensor of a component of a magnetic field is that the latter is less sensitive to gradients of parasite magnetic fields generated for example by currents circulating in distant parasite wire conductors. In fact, on any given point, the magnetic field created by a wire conductor is proportional to $1/r$, $r$ representing the distance between the given point and the centre of the wire conductor. The gradient of the magnetic field is proportional thereto to $1/r^2$.

In this document, the sensor is made by a cantilever beam conductive of electricity embedded at its two ends. It is fed with alternating current at a frequency corresponding to a mechanical even resonance mode of the beam. A magnetic field gradient causes deformation of the beam and detection of this deformation goes back to measuring of the gradient of the magnetic field. The disadvantage of this sensor is that it consumes electricity relatively substantially. Also, measuring precision is conditioned by the homogeneity of the mechanical and electric properties of the beam over its whole length.

Document [4] describes, as a gradient sensor of a component of a magnetic field, an optical fiber covered in hard ferromagnetic material such as samarium-cobalt, neodymium-iron-boron or barium-iron and whereof the two ends are fitted. A magnetic field gradient generates a force which deforms the optical fiber. Deformation is detected by interferometry in the optical fiber. Using optical fiber does not produce a sensor on the micrometric scale via collective technologies of microelectronics or microelectromechanics.

Document [5] describes a gradient sensor of a component of a magnetic field comprising a beam made of piezoelectric material fitted at one end and the other end of which is free and supports a permanent magnet. The force created by the gradient of the component of the magnetic field on the permanent magnet causes stress in the piezoelectric material of the beam and therefore causes the appearance of electric voltage which can be measured.

A disadvantage of the structure described in document [5] and that described in document [4] is that, when the magnet is subjected to a magnetic field which is not colinear to its magnetization direction, it is subjected to torque which can generate parasite deformation on the beam or on the optical fiber. This can impair measuring precision or at the very least substantially restrict the conditions of use of the detector.

Further reference is now made to the detail of the physical principles used in document [5] in referring to FIGS. 1A and 1B on which an orthonormal marker x,y,z is indicated.

When a permanent magnet 1 is subjected to a gradient of a component of a magnetic field, a force F is applied to it and this force F is proportional to the magnetic field gradient. Throughout the description, for simplification a number of references will be made to magnetic field and magnetic field gradient instead of gradient of a component of the magnetic field.

The volumic force generated by a magnetic field containing the magnet 1 is expressed by:

$$\delta \vec{F} = -(\vec{M} \bullet \vec{\nabla}) \vec{B} \qquad (1)$$

So if the magnetic field B is oriented according to the axis y, and if the magnetic field gradient is oriented according to the axis z, the force F which is applied to the permanent magnet 1 is oriented according to the axis y if the permanent magnet 1 has a magnetization direction M oriented according to the axis z. It is assumed that the magnetic field B is created by a current i circulating in a wire electric conductor 2 oriented according to the axis x. In relation to a cross-section of the wire conductor 2, the magnetic field B is tangential and the magnetic field gradient is radial. The magnet 1 is placed, for example, at a free end 4 of a beam 3, the other end 5 of which is fitted.

A magnetic field perpendicular to a magnetic field gradient, as is the case for the field created by a wire conductor, will create, in addition to the force, a torque C on the permanent magnet 1 which will deform the beam 3 torsionally according to z and y. This torque will perturb the effect of measuring the force F created by the magnetic field gradient engendered by the circulation of the current i. This deformation will be substantially identical to that generated by the magnetic field gradient which is also according to z.

Analytical calculation shows that deflection of the beam Zgrad due to the magnetic field gradient and that deflection of the beam Zfield due to torque generated by the magnetic field orthogonal to the magnetization of the permanent magnet have substantially the same order of variable.

$$zgrad = 4\frac{VmagnetM(\partial Bx/\partial r)}{EWt^3}L^3 \qquad (2)$$

$$zfield = 6\frac{VmagnetMBx}{EWt^3}L^2 \qquad (3)$$

$$\frac{zgrad}{zfield} = \frac{2L}{3r} \qquad (4)$$

with

Vmagnet is the volume of the permanent magnet
M is its magnetization
Bx is the component of the magnetic field according to the axis x
r is the distance between the centre of the wire conductor, supposedly cylindrical, and the magnet
E is the Young's modulus of the material of the beam
W is the width of the beam
t is the thickness of the beam
L is the length of the beam The equation (4) shows that to differentiate at maximum the deflection of the beam Zgrad from the deflection of the beam Zfield, there is a need to minimise r located in the denominator and to maximise L located in the numerator of the fraction. This variable r is conditioned by the radius of the wire conductor and by the thickness of the beam which corresponds to a substrate on which is placed the permanent magnet in the event of production by microelectronics or microelectromechanics technology. The act of maximising the length of the beam is contrary to the miniaturisation aims of the sensor.

It is evident that it is not possible to distinguish these two deformations from one another. FIGS. 2A and 2B illustrate these comments. FIG. 2A illustrates the digital simulation of the deformation of a silicon beam with:

L=1000 micrometers,
W=100 micrometers and
t=1 micrometer.

The beam is equipped at one free end with a parallelepipedic permanent magnet of 100×100×1 cubed micrometers, under the effect of a magnetic field gradient equivalent to that generated by a current from 1A circulating in a wire conductor located 1 millimetre from the permanent magnet.

The deflection Zgrad of the end of the beam is 350 nm in FIG. 2A.

For the same beam, permanent magnet and wire conductor assembly, FIG. 2B illustrates deflection of the beam under the effect of a magnetic field equivalent to that generated by circulation of the current. The deflection Zfield of the end of the beam is 550 nm.

So that the magnetization direction of the magnet is colinear to the magnetic field and accordingly to prevent creation of torque on the magnet, document [5] proposes arranging two wire conductors 2' parallel and close to one another equidistant from the permanent magnet 1, as in FIG. 1C. The same electric current flows through the two wire conductors 2', in the opposite direction. So now the magnetic field is directed according to z as for the magnetic field gradient and as for the magnetization M of the permanent magnet 1. The disadvantages of this device are that it is both difficult to position the permanent magnet 1 so that it is perfectly equidistant from the two wire conductors 2' and also that the same current must circulate in both wire conductors 2'. In the event of a difference, measuring the magnetic field gradient will be unreliable.

DISCLOSURE OF THE INVENTION

The actual aim of the present invention is to propose a gradient sensor of a component of a magnetic field provided with a permanent magnet which has none of the disadvantages mentioned earlier.

More particularly, the aim of the present invention is to propose such a sensor which distinguishes the contribution of the force generated by the gradient from that of the torque generated by the magnetic field when it is not colinear to the magnetization direction of the magnet.

Another aim of the invention is to propose such a sensor wherein the positioning precision of the sensor has little influence on the precision of the measurement.

Yet another aim of the invention is to propose such a sensor which consumes little energy in operation.

To achieve this, the present invention proposes placing the magnet on a deformable mass able to deform under the effect of a force exerted on the magnet by the gradient, the effect of this force being to shift the magnet in a direction substantially colinear to the component of the magnetic field for which the sensor has to acquire the gradient, the deformable mass being anchored in at least two points substantially opposite relative to the deformable mass to a fixed device support, the magnet having a magnetization direction which is substantially colinear to the direction of the gradient of the component of the magnetic field which the sensor has to acquire.

More precisely, the present invention is a gradient sensor of a component of a magnetic field comprising at least one elementary sensor comprising a deformable mass equipped with a permanent magnet having a magnetization direction substantially colinear to the direction of the gradient of the component of the magnetic field to be acquired by the sensor. The deformable mass is able to deform under the effect of a force exerted on the magnet by the gradient, the effect of this force being to shift it, by dragging the deformable mass, in a direction substantially colinear to the component of the magnetic field for which the sensor has to acquire the gradient. The deformable mass is anchored to a fixed support device in at least two anchoring points substantially opposite relative to the mass. The elementary sensor also comprises measuring means of at least one electric variable translating deformation or stress of the deformable mass engendered by the gradient.

When the deformable mass extends at rest substantially in a plane, the magnetization direction of the permanent magnet is preferably substantially normal to the plane.

An anchoring point of the deformable mass can be connected directly to the support device or indirectly by means of an elastic arm.

The deformable mass can be suspended relative to the support device by means of at least two elastic arms directed substantially in the plane of the deformable mass.

The elastic arms can comprise at least one main section. Two elastic arms forming a pair have main sections located in the extension of one another.

The magnet is preferably shifted according to an axis of the plane, substantially normal to the axis of the main sections.

When the elementary sensor comprises two pairs of elastic arms, the anchoring points of the deformable mass to which two elastic arms not belonging to the same pair are connected are as far away as possible.

When the elementary sensor comprises two pairs of elastic arms, the anchoring points of the deformable mass to which the elastic arms of both pairs are connected are placed symmetrically relative to an axis of symmetry of the deformable mass.

The elastic arms have such a thickness and width such that their thickness is greater than their width to be more rigid according to directions substantially orthogonal to the direction of the force exerted on the magnet by the gradient.

Each elastic arm can comprise an additional section connected to the main section and arranged in such a way that two adjacent anchoring points of the deformable mass to which two elastic arms of different pairs are connected are less distant than anchoring points to which said elastic arms are connected on the support device.

When the elementary sensor comprises a single pair of elastic arms, the axis of the main sections of the elastic arms is merged with an axis of symmetry of the deformable mass.

The measuring means of a variable translating the stress or the deformation can be differential. This even more facilitates the distinction between deformation due to force and that due to torque.

The differential measuring means can be capacitive or comprise at least one pair of strain gauges.

The sensor can also comprise excitation means of the deformable mass to make it vibrate, these excitation means being especially electrostatic, piezoelectric or magnetic.

The deformable mass can exhibit a deformation which is non linear as a function of the force which is applied to the magnet due to the gradient.

To distinguish a contribution due to a magnetic field gradient from that due to acceleration and optionally measure the gradient and the acceleration simultaneously, the sensor can comprise two elementary sensors in which the magnets of the deformable masses have opposite magnetization directions.

The deformable mass can be anchored to the support device at the level of one or more zones of its periphery or over its entire periphery.

The present invention also concerns a production process of a gradient sensor of a component of a magnetic field, comprising the steps consisting of:

providing a base substrate comprising a sacrificial layer embedded under a superficial layer made of semi-conductor material, hollowing at least one caisson in the superficial layer without reaching the sacrificial layer, this caisson being intended to house a permanent magnet before being incorporated in a deformable mass delimited later in the superficial layer, filling the caisson with magnetic material and magnetising the magnetic material in the caisson forming metallic contacts on the superficial layer intended for measuring means of at least one electric variable translating deformation or stress of the deformable mass engendered by the gradient, this gradient being substantially colinear to the magnetization direction of the magnet, etching in the superficial layer one or more trenches revealing the sacrificial layer so as to delimit the contour of the deformable mass and of at least two anchoring points of the deformable mass on a fixed support device, these two points being opposite relative to the deformable mass, eliminating the sacrificial layer under the deformable mass to release it so that the anchoring points remain connected to the support device.

The caisson can be carpeted with a barrier layer before filling to prevent diffusion.

The magnet can be coated superficially with a passivation layer before formation of the electric contacts.

An annealing step can be conducted before magnetising to crystallise the magnetic material.

BRIEF DESCRIPTION OF THE DRAWINGS

The present invention will be better understood from the description of given exemplary embodiments, purely by way of indication and non-limiting, in reference to the attached diagrams, in which:

FIG. 1A (already described) shows the force applying to a magnet placed at the end of a beam when it is beside a wire conductor through which electric current flows;

FIG. 1B (already described) shows the torque caused by a magnetic field to which a magnet placed at the end of a beam is subjected and the deformation of this beam resulting from this torque;

FIG. 1C (already described) shows the gradient sensor of a component of a magnetic field illustrated in document [4];

FIGS. 4A and 5 to 7 show, in a plan view, several examples of gradient sensors of a component of a magnetic field according to the invention having two pairs of elastic arms, FIGS. 4B and 4C showing other examples of mobile mass of gradient sensors of a component of a magnetic field according to the invention;

FIGS. 13A to 13G show in section steps for producing a sensor according to the invention;

Identical, similar or equivalent parts of the different figures described hereinbelow bear the same reference numerals so as to make it easy to move from one figure to the other.

The different parts illustrated in the figures are not necessarily different according to a uniform scale, so as to make the figures more legible.

DETAILED EXPLANATION OF PARTICULAR EMBODIMENTS

Figure 2A:
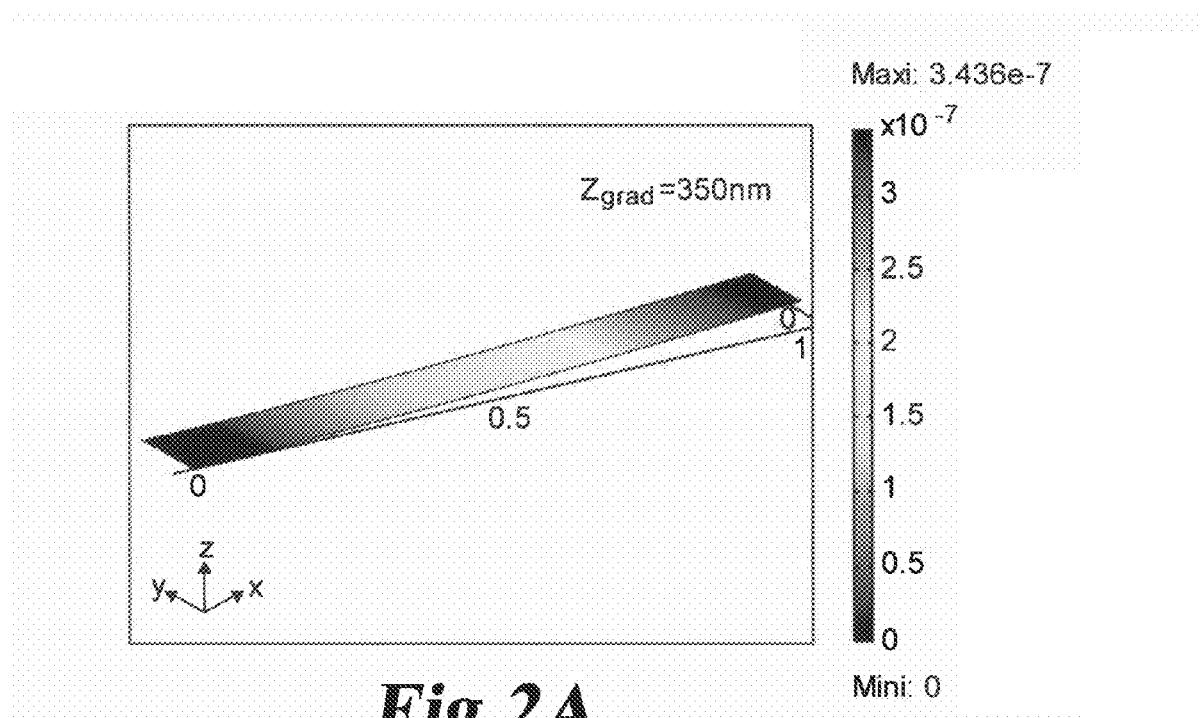
FIGS. 2A, 2B (already described) show the deformation of a beam bearing at its end a magnet under the effect respectively of a magnetic field gradient and a magnetic field.
Figure 2B:
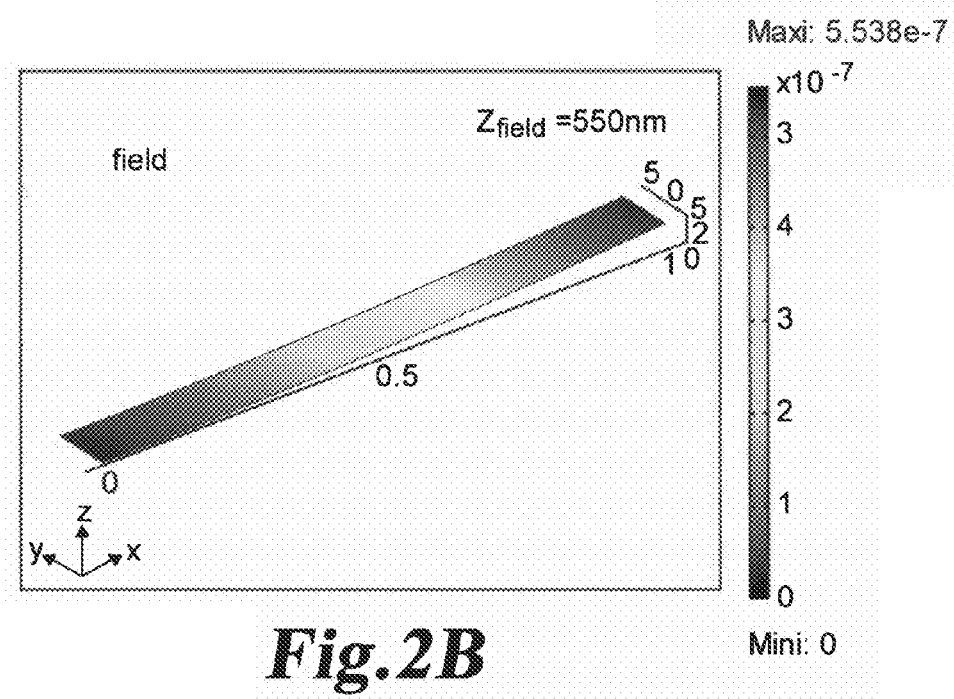
Figure 3:
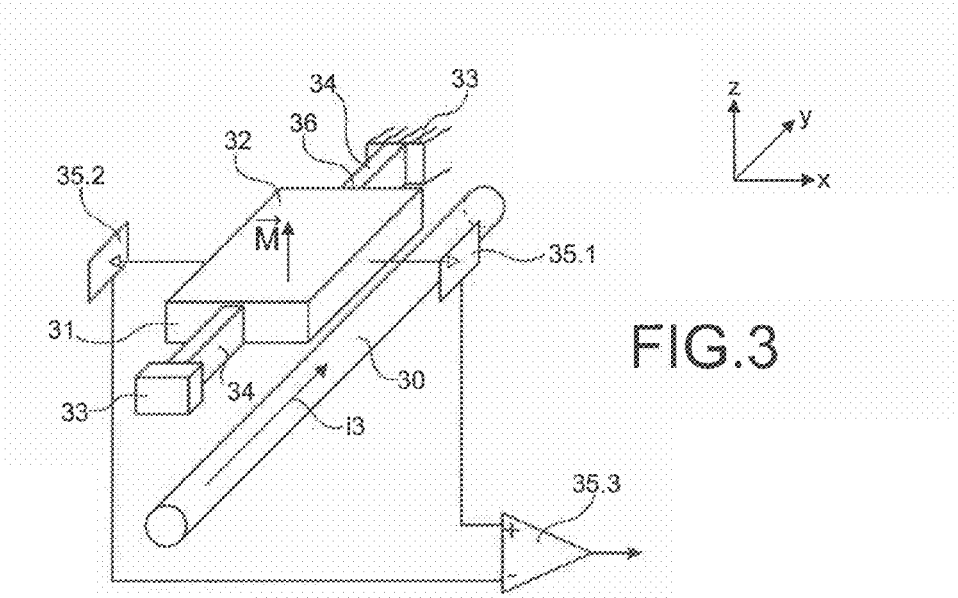
FIG. 3 shows an example of a gradient sensor of a component of a magnetic field according to the invention having only one pair of elastic arms.

Reference is now made to FIG. 3 which shows a gradient sensor of a component of a magnetic field according to the invention. It is assumed that the magnetic field is generated by a current i3 circulating in a electric wire conductor 30 directed according to the axis y of the orthonormal marker. The gradient sensor of the component of the magnetic field comprises at least one elementary sensor CE1 comprising a deformable mass 31 equipped with a permanent magnet 32. The deformable mass 31 lays at rest in the plane x,y. The deformable mass 31 can take the form of a membrane, which means that its thickness is much less than its two other dimensions. The deformable mass 31 is able to deform under the effect of a force exerted by the magnetic field gradient, this force being applied to the magnet 32. The effect of this force is to shift the magnet 32 and the latter locally brings with it the deformable mass 31, resulting in its deformation. The shift is made in a direction substantially colinear to the component of the magnetic field for which the sensor must acquire the gradient. The state of deformation of the deformable mass 31 will be different according to the intensity of the applied magnetic field gradient.

The magnetization M of the magnet 32 is directed according to the axis z. More precisely, the magnet 32 has a magnetization direction which is substantially colinear to the direction of the gradient of the component of the magnetic field which the sensor must acquire.

The deformable mass 31 is anchored in at least two points 36 substantially opposite relative to the deformable mass, to a fixed support device 33. The support device 33 is called fixed as it remains immobile relative to the deformable mass 31 when the latter makes a shift caused by the magnet 32.

In the example illustrated in FIG. 3, the deformable mass 31 is suspended on the support device 33 by means of a pair of elastic arms 34. Elastic arms mean arms which are able to deform under the effect of stress and which regain their initial form after the stress is cancelled. A plurality of pairs of elastic arms could be used or even an uneven number of elastic arms strictly more than one could be used. The elastic arms 34 are fixed on one side on the support device 33 and on the other side to an edge of the deformable mass 31. The elastic arms extend at rest in the plane x,y. Each elastic arm 34 of a pair comprises a section called main section 34' extending transversally between the deformable mass 31 and the support device 33. The main sections 34' of the elastic arms 34 of a pair are in extension of one another. The main sections 34' extend according to the axis y. In the example of FIG. 3, the elastic arms and the main sections are one only.

The elastic arms 34 are illustrated rectilinear and oriented according to the axis y, just like the wire conductor 30. Other configurations are possible. If the magnetic field gradient is not generated by a current circulating in a wire electric conductor, the sensor is positioned according to the invention such that the magnetic field gradient is colinear with the magnetization direction M of the permanent magnet 32 and the direction of the magnetic field is colinear to the axis x of displacement of the magnet 32.

When there is only a single pair of elastic arms 34, it is preferable for the axis of their main sections 34' to pass through the centre of gravity of the deformable mass 31. The axis y of the main sections 34' is merged with an axis of symmetry y1 of the deformable mass 31. This symmetry is in effect required to distinguish the contribution due to the field gradient from that due to a magnetic field.

The elementary sensor further comprises measuring means 35 of an electric variable translating stress or deformation of the deformable mass 31 engendered by the gradient. The deformation results from displacement of the magnet 31, and this displacement is directed according to the axis x, that is, transversally to the axis of the main sections 34'. This deformation occurs when the deformable mass 31 is subjected to a magnetic field gradient according to z, the magnetic field being oriented according to the axis x. In the embodiment of FIG. 3, the gradient is oriented according to the axis z while the magnetic field which generates it is oriented according to the axis x. In the example described in FIG. 3, it is assumed that the measuring means 35 conduct a differential measuring and that they are of capacitive type with a pair of electrodes 35.1, 35.2 vis-à-vis either side of the permanent magnet 30. They measure a variation in capacity. One of the electrodes 35.1 is connected to an input of a differential amplifier 35.3 and the other electrode 35.2 to the other input. Each of these electrodes 35.1, 35.2 measures a voltage signal and the differential amplifier delivers a signal representative of a variation in capacity vis-à-vis the permanent magnet 32. The support device 33 is brought to electric mass. This variation in capacity translates a lateral shift of the deformable mass 31 and therefore a deformation of the latter. The electrodes 35.1, 35.2 of the pair have a face substantially transversal to the direction of the measured shift.

The shift created by the magnetic field gradient varies the signal output by each of the electrodes 35.1, 35.2 in opposite directions, whereas a shift engendered by a torque created by the magnetic field according to x or according to y, combined with the magnetization M of the permanent magnet 32 varies the signal output by each of the electrodes 35.1, 35.2 in the same direction. With such differential measuring, during measuring of the lateral shift, the contribution due to the magnetic field can be eliminated to the extent where it is not colinear to the magnetization direction of the permanent magnet 32 and engenders torque. Only the contribution due to the magnetic field gradient is retained.

Figure 4A:
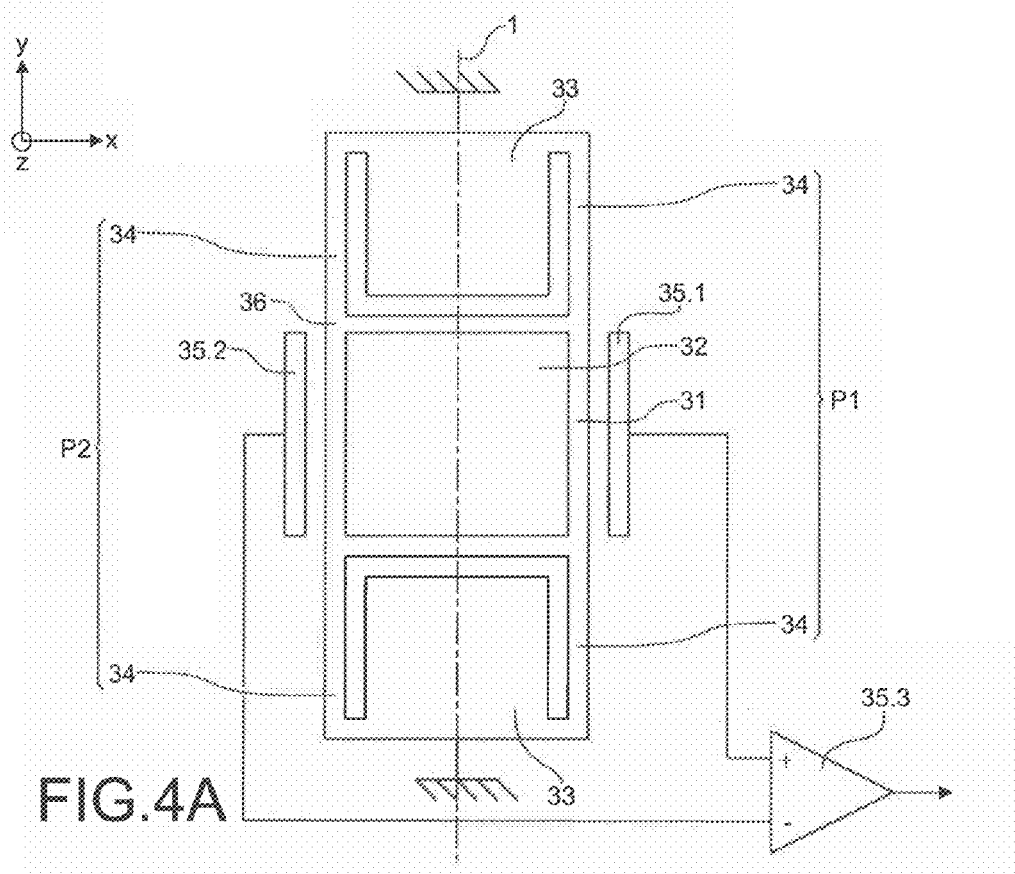

FIG. 4A shows in plan view a gradient sensor of a component of a magnetic field according to the invention. A difference to that illustrated in FIG. 3 is at the level of the elastic arms 34 which are now distributed in two pairs P1, P2. The anchoring points 36 of the deformable mass 31 to which two elastic arms 34 not belonging to the same pair P1 or P2 of elastic arms are connected are as far away as possible. In the example, these anchoring points 36 are at the level of the corners of the deformable mass 31 which takes the form of a substantially rectangular membrane. The two pairs P1, P2 of arms are arranged substantially symmetrically relative to an axis of symmetry y1 about which the deformable mass 31 is constructed. This axis of symmetry y1 is oriented according to the axis y. Such anchoring with two pairs P1, P2 of elastic arms further limits the impact of torque generated by the combination of the magnetic field oriented according to the axis x or y and of the magnetization of the magnet oriented according to the axis z. The two embodiments of FIGS. 3 and 4A function without means for forced vibration of the deformable mass 31. Displacement of the magnet and therefore of the deformable mass 31 is due only to the magnetic field gradient and to a lesser extent to the magnetic field itself, since with the two pairs P1, P2 of elastic arms the sensor is minimally sensitive to the torque generated by the combination of the magnetic field and of the magnetization of the permanent magnet.

Of course the sensor can function with an uneven number of elastic arms, this number being greater than one. Three elastic arms distributed substantially equidistant or not around the deformable mass 31 can be envisaged, for example.

Figure 4B:
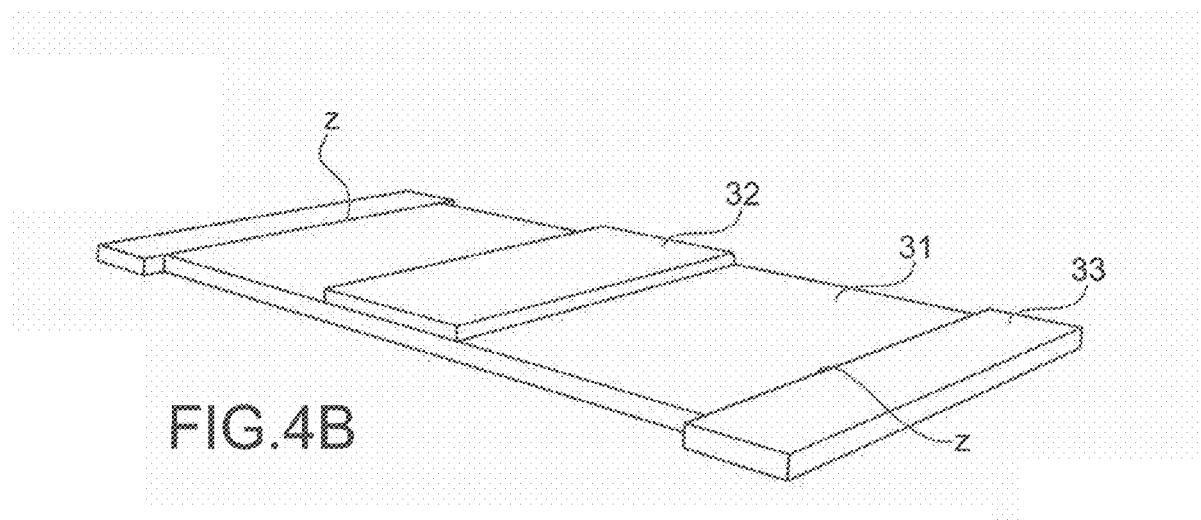
Figure 4C:
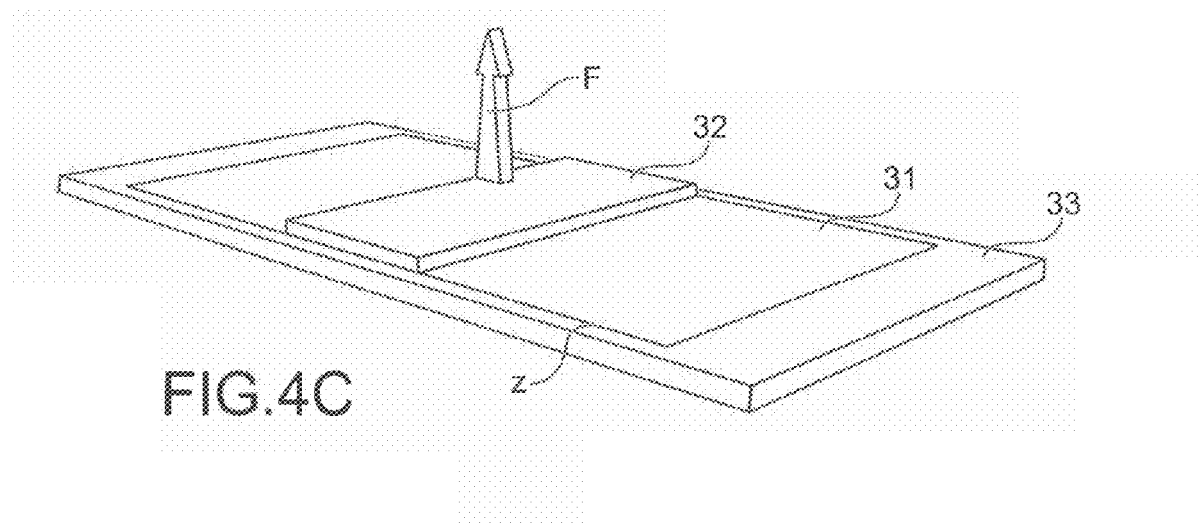

It is possible to dispense with elastic arms, as the deformable mass 31 can then be directly anchored to the support device 33. In FIGS. 4B, 4C, the deformable mass 31 is anchored in one or more zones Z, called embedding, of its periphery on the support device 33, each zone Z corresponding to a plurality of successive anchoring points. In FIG. 4B, the deformable mass 31 takes the form of a substantially rectangular beam and the zones correspond to its two widths, they are anchored to the fixed support device 33.

As a variant illustrated in FIG. 4C, anchoring to the fixed support device 33 is done in the zone Z of the periphery, corresponding to the entire periphery of the deformable mass 31.

In the example described in FIG. 4A, the measuring means of the electric variable translating deformation of the deformable mass are of the same type as those described in FIG. 3. Detection is differential, and is done capacitively, the magnetic field gradient only deforming and therefore displacing the deformable mass 31.

It is possible to provide excitation means of the deformable mass 31 to make it vibrate. In this case, a deformable mass whereof the deformation is non linear as a function of the force which is applied to the magnet due to the magnetic field gradient is selected. The deformable mass 31 will vibrate differently according to the intensity of the force which is applied to it via the magnet in the presence of a magnetic field gradient. The magnetic field gradient can then be measured by drawing part of the vibratory response of the deformable mass 31. Several techniques can be used to obtain the gradient. Excitation and measuring of the electric variable representative of the deformation or of the stress can be obtained in different ways.

In FIG. 5, the excitation means 40 of the deformable mass 31 are electrostatic and are coupled to differential measuring means 35 of an electric variable translating stress or deformation of the deformable mass 31 engendered by the gradient. The excitation means 40 comprise two opposing electrodes 40.1, 40.2 fed in phase opposition. Alternative voltage Vac superposed on continuous voltage Vdc is applied to the former. The alternative voltages are in phase opposition from one electrode to the other. The differential measuring means 35 now comprise two opposing pairs of electrodes (35.1, 35.2), (35.4, 35.5), located on either side of an electrode of the excitation means 40.

One electrode 35.1, 35.4 of a pair is connected to an input of the differential amplifier 35.3 and the other electrode 35.2, 35.5 is connected to the other.

It is possible, by way of variant, to exploit the frequency of vibration to which the deformable mass is subjected.

If the deformable mass is excited at a fundamental frequency f0, it will deform by engendering harmonics at the frequency 2f0, 3f0, 4f0, . . . . Amplitude of the harmonics depends on deformation of the deformable mass 31 due to the magnetic field gradient or stress forming in the deformable mass. Another method can use the resonance frequency. The resonance frequency of the beam can vary as a function of the magnetic field gradient. The determination of the gradient can be obtained by searching for this resonance frequency or by measuring variations in amplitude around the resonance.

Figure 15A:
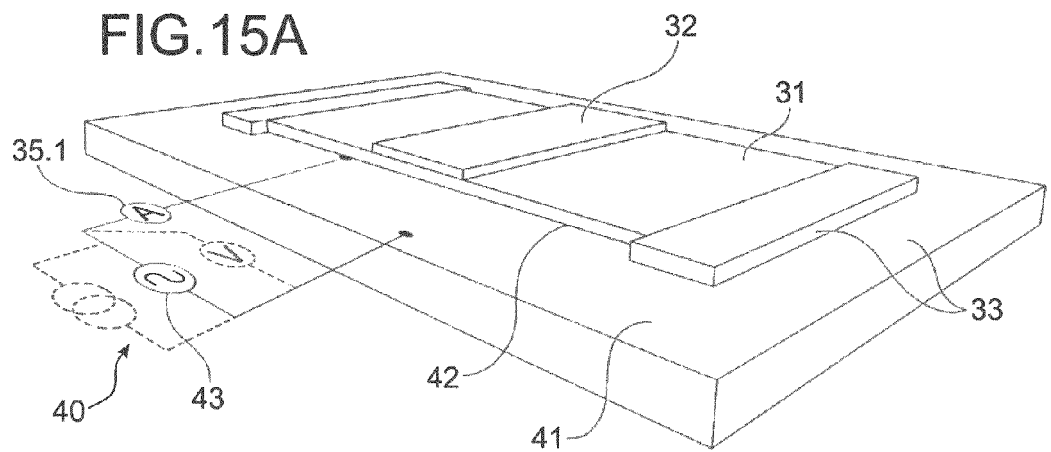
FIGS. 15A, 15B, 15C illustrate other variants of sensors according to the invention in which the excitation means are respectively electrostatic, piezoelectric and magnetic.

FIG. 15A shows a sensor according to the invention wherein the excitation means 40 are electrostatic. The deformable mass 31 takes the form of a substantially rectangular membrane which is anchored in two end zones 31.1 to a support device 33. The term membrane will be employed hereinbelow. The support device 33 takes the form of a substrate. The deformable mass 31 is thus suspended above the substrate 33. The excitation means comprise two opposite conductive planes 42, 41. One of the planes 42 is on one face of the membrane 31 to the side of the support device 33. The other conductive plane 41 is on the support device 33 to the side of the membrane 31. In connecting these two conductive planes 41, 42 to an alternative voltage source 43 preferably having a controllable frequency, an alternative attraction force forms between the membrane 31 and the support device 33. The frequency substantially is advantageously selected equal to the fundamental resonance frequency of the membrane 31. Other frequencies are possible but would need more power. The measuring means of the electric variable translating deformation or stress of the deformable mass 31 are measuring means of the current 35.1 circulating between one of the conductive planes 42 and the voltage source 43. This is no longer about differential measuring. More particularly, following the evolution of the harmonics of the current can return to the magnetic field gradient. Inversely, it would be possible to use a current source in place of a voltage source to feed the conductive planes and to provide voltage-measuring means at the terminals of the conductive planes 41, 42. This variant is represented, in dotted lines, superposed on the embodiment with the voltage source and the measuring means of the current so as not to ineffectively multiply the number of figures. But it poses no problem for the person skilled in the art.

Figure 15B:
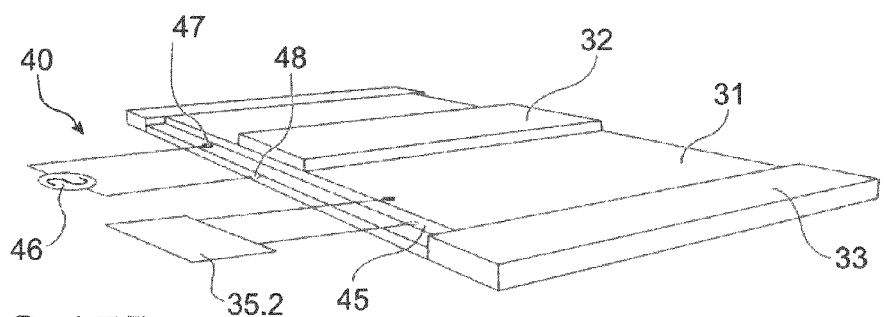
Figure 15C:
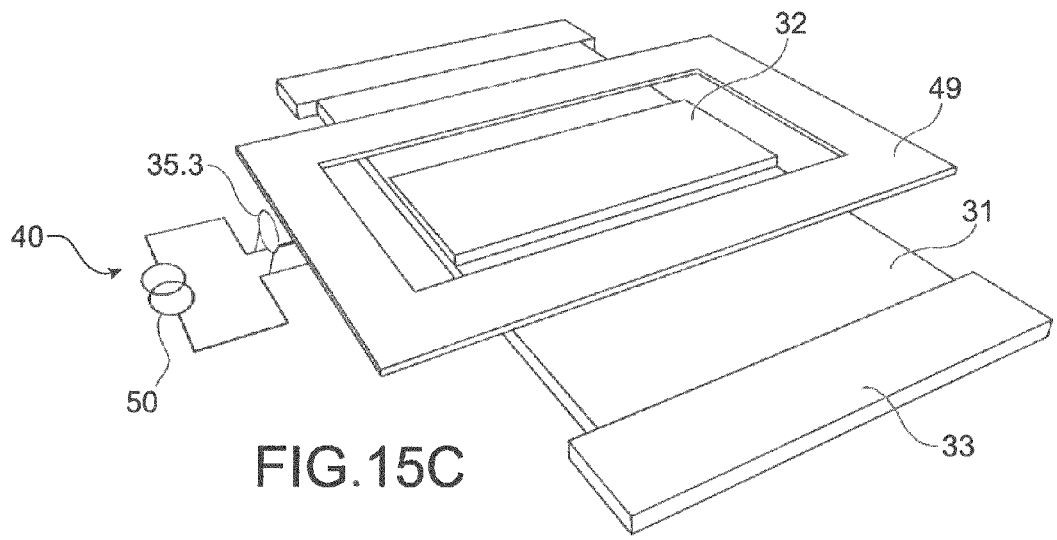

In FIG. 15B the membrane is in the same form as in FIG. 15A and the excitation means 40 are piezoelectric. They comprise a piezoelectric element 45 in mechanical contact with the membrane 31 and a voltage supply source 46 having a controllable frequency to excite the piezoelectric element 45 via a pair of electrodes 47, 48 located on either side of the element 45 made of piezoelectric material. This element 45 can be a plate of piezoelectric material stuck under the membrane 31. When the piezoelectric element 45 is excited, it creates stresses within the membrane 31 and makes it vibrate. In place of using a piezoelectric element of plate type arranged as just described, it is possible to use a stud made of piezoelectric material which serves to anchor the membrane to the support device. Exciting this stud allows the membrane to vibrate. The frequency is selected to correspond to the fundamental resonance frequency of the membrane 31. The detection means of an electric variable translating stress due to deformation in the membrane 31 due to the magnetic field gradient can be created by an impedance analyser 35.2 for measuring and following the evolution of the impedance of the piezoelectric element. Measuring the impedance goes back to stress and therefore to deformation in the membrane and therefore to the magnetic field gradient. In FIG. 15C, the membrane is in the same form as in FIG. 15A and the excitation means 40 are magnetic. They comprise a bobbin 49 connected to an alternating-current supply source 50 preferably at a controllable frequency. The frequency is advantageously selected substantially equal to the fundamental resonance frequency of the membrane. Circulation of the alternating current generates an alternative force which is applied to the magnet 32 and is superposed on that generated by the magnetic field gradient. The detection means of an electric variable translating deformation of the membrane include means for measuring 35.3 the voltage at the terminals of the coil 49. The coil 49 can be positioned on the membrane on the same side as the magnet 32 or be on the other side. By way of variant, it can be located close to the membrane 31 without being supported on the latter. If the membrane 31 and the magnet 32 are formed by a MEMS (micro-electro-mechanic system) the coil can be placed outside the MEMS, if preferred. It is positioned such that the magnetic field created by the circulation of the current is colinear to the magnetization of the magnet 32.

In the three examples described in FIG. 15, it is possible to invert the currents and voltages. Excitation can be carried out by imposing the current and detection is done by measuring voltage, or on the contrary excitation can be carried out by imposing voltage and detection by measuring current.

Figure 6:
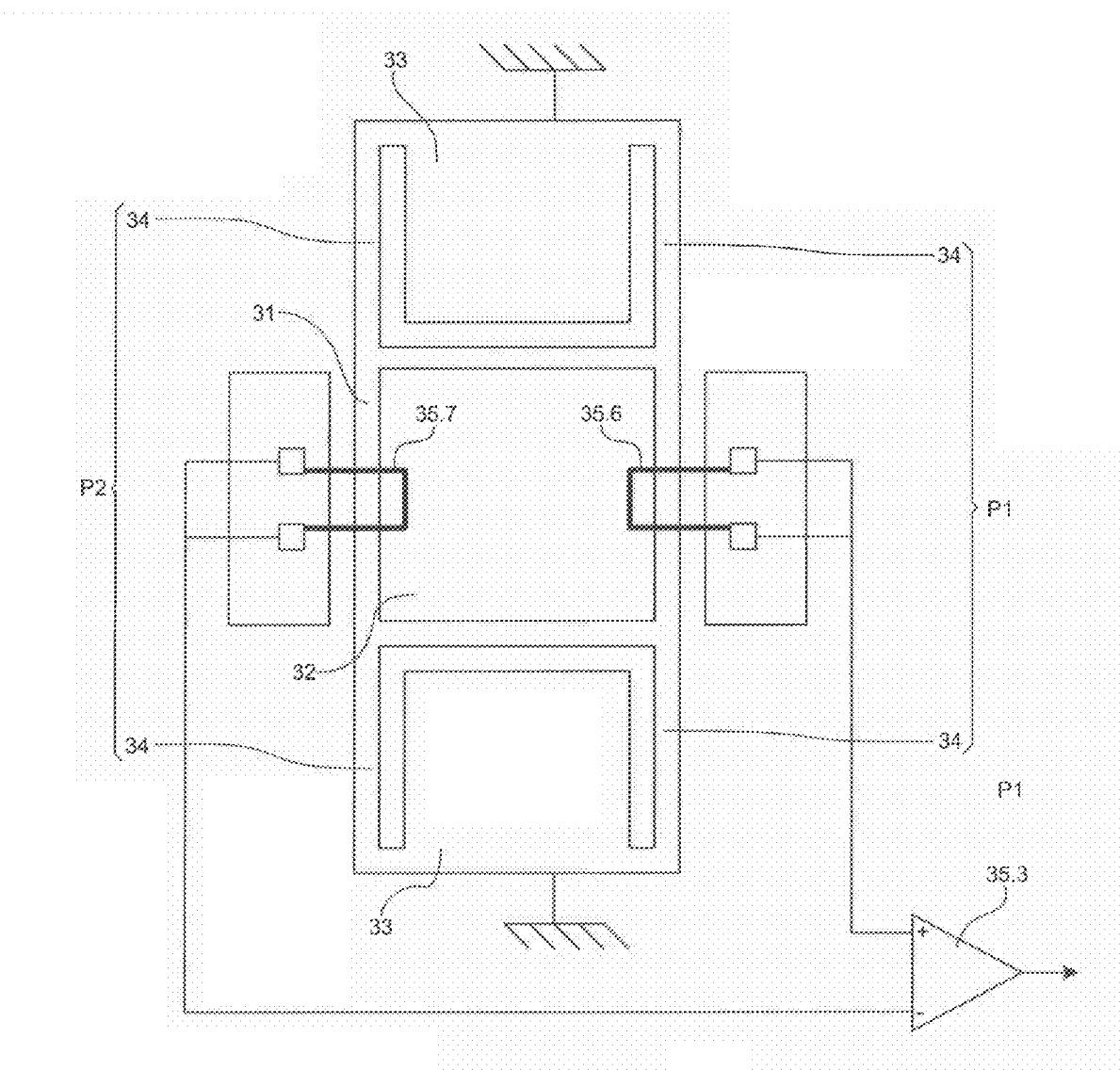

FIG. 6 again shows an embodiment of a sensor according to the invention. In this FIG. 6, the measuring means 35 are formed by a pair of strain gauges 35.6, 35.7. Again, these are differential measuring means. These can be metallic piezo-resistive gauges, placed between the deformable mass 31 and an anchored zone. The strain gauges 35.6, 35.7 are connected via input of a differential amplifier 35.3. The strain gauges 35.6, 35.7 output signals translating stress generated by the force exerted on the magnet by the magnetic field gradient.

Figure 7:
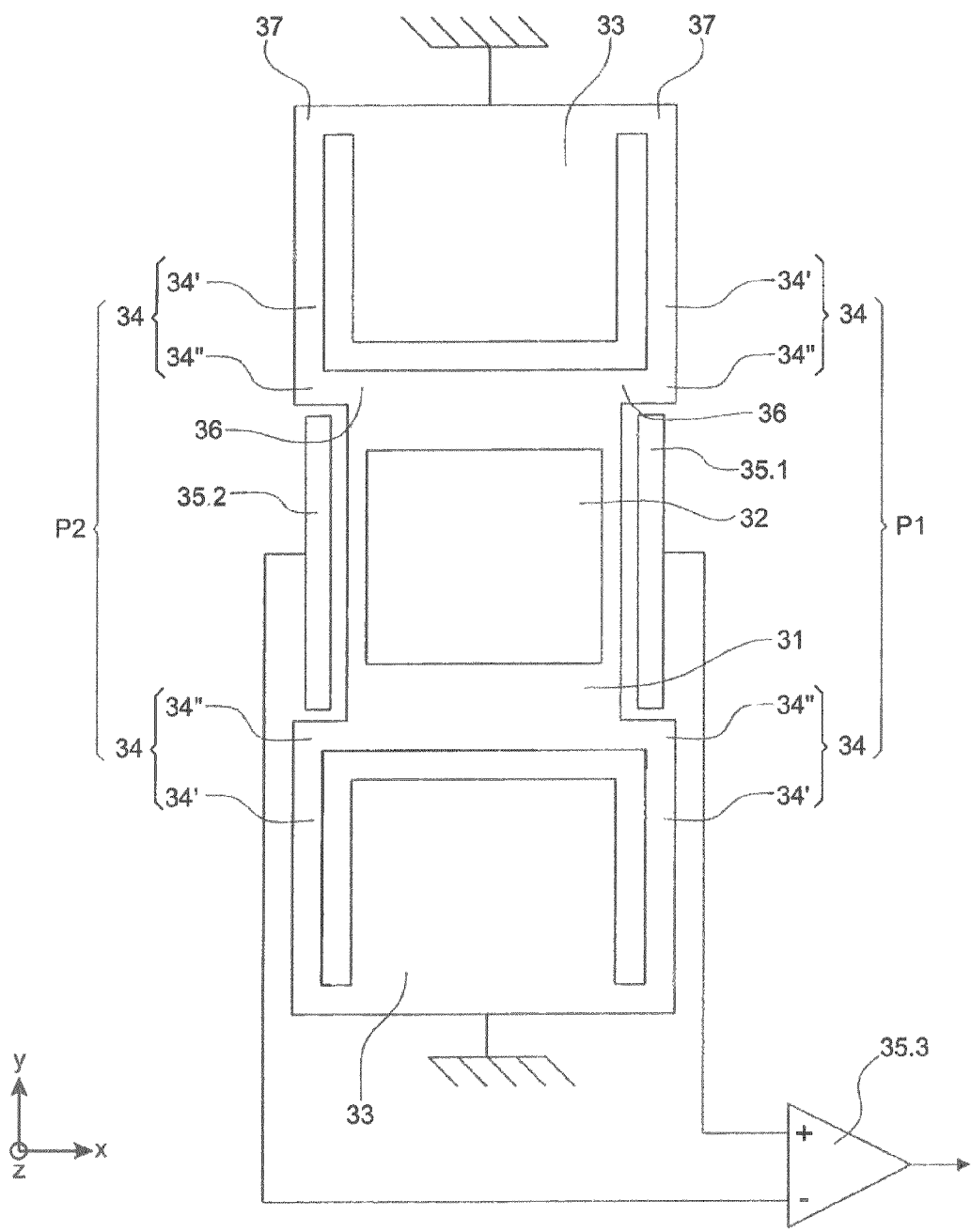

FIG. 7 shows another variant of a sensor according to the invention. The difference relative to the embodiments described previously is in the configuration of the elastic arms 34. There are two pairs P1, P2 of them, as in FIGS. 4 to 6, fixed at the corners of the resonating structure 31, but now they each comprise two sections 34', 34" connected to one another, one of the sections 34" being connected to the deformable mass 31 and the other to the support device 33. The section 34" connected to the deformable mass 31 is called additional, and is directed substantially according to the axis x, while the section 34' connected to the support device 33 is directed substantially according to the axis y, it corresponds to the main section. Such a configuration increases the lever arm between the deformable mass 31 and the support device 33 without having to boost the volume of the deformable mass 31 and therefore its mass.

Two adjacent anchoring points 36 on the deformable mass 31 belonging to two elastic arms 34 of different pairs P1, P2 are less distant than the anchoring points 37 from these elastic arms 34 on the support device 33.

Figure 8A:
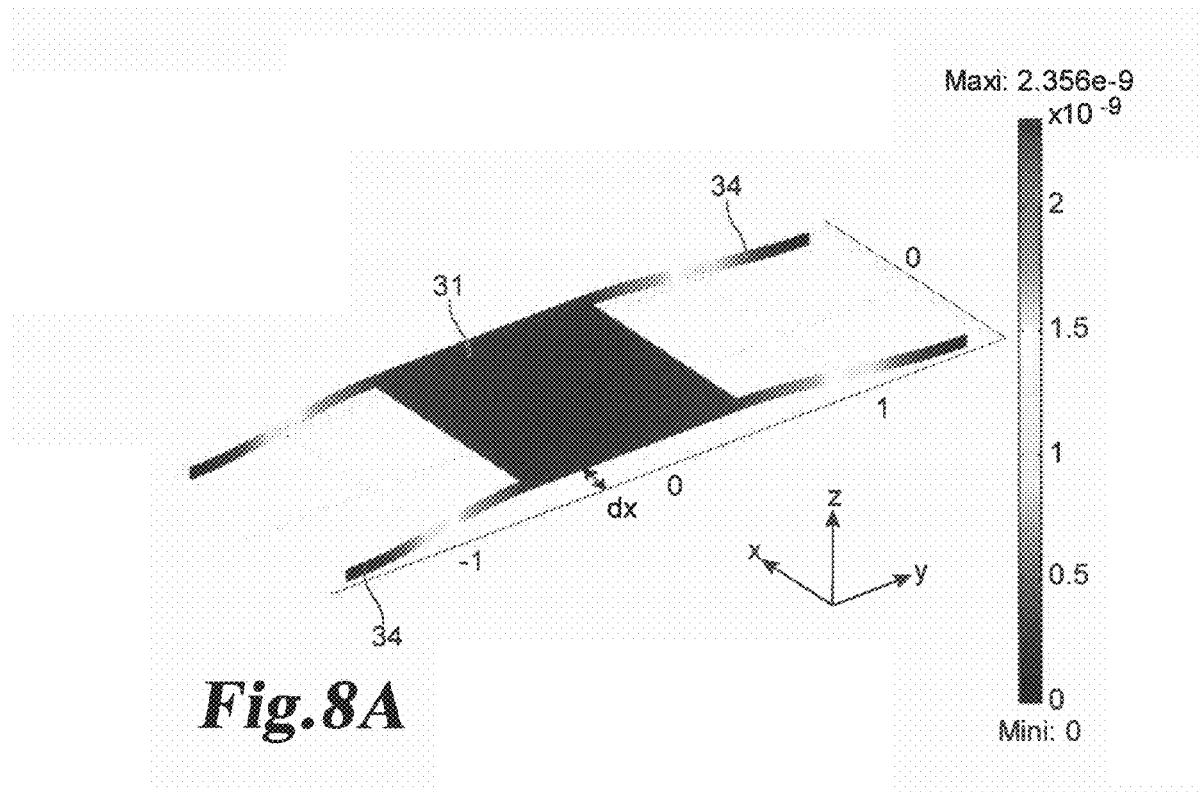
FIGS. 8A, 8B, 8C respectively show deformation of a sensor of FIG. 4, when subjected to a magnetic field gradient of axis z, to a magnetic field of axis y and to a magnetic field of axis x.

Reference will now be made to simulations made with a gradient sensor of a component of a magnetic field according to the invention with reference to FIGS. 8A, 8B, 8C.

These simulations have been created using a gradient sensor of a component of a magnetic field comparable from the structural viewpoint to that illustrated in FIG. 4A, having the following characteristic:

Dimensions of the deformable mass 31: 100×100×5 cubed micrometers

Dimensions of the elastic arms 34 which are substantially rectilinear: 100×1×5 cubed micrometers The permanent magnet included in the deformable mass 31 is magnetised vertically (axis z). The deformable mass 31 extends substantially in the plane x,y at rest. In FIG. 8A, the deformable mass 31 is subjected to a magnetic field gradient directed according to the axis z, that is, in the same direction as the magnetization of the permanent magnet 32. The elastic arms 34 distributed in two pairs extend according to the axis y at rest. It is assumed that the magnetic field gradient is engendered by circulation of a current of 1A in a wire conductor substantially cylindrical and placed 1 mm from the permanent magnet and directed in the plane x,y. The wire conductor is not illustrated and the permanent magnet neither.

Lateral displacement dx of the deformable mass 31 happens along axis x, that is, substantially perpendicularly to the axis y of the elastic arms 34 and to the axis z of the magnetization of the permanent magnet 1. This displacement is caused by a magnetic field gradient oriented according to the axis z as for magnetization of the permanent magnet 32. This lateral displacement dx is 2.35 nm.

Because of its structure with two pairs P1, P2 of elastic arms 34 placed at all four corners of the substantially rectangular deformable mass 31, the sensor is minimally sensitive to torque generated by the combination of the magnetization of the permanent magnet and the magnetic field, to the extent where the magnetic field is not colinear to the magnetization.

Figure 8B:
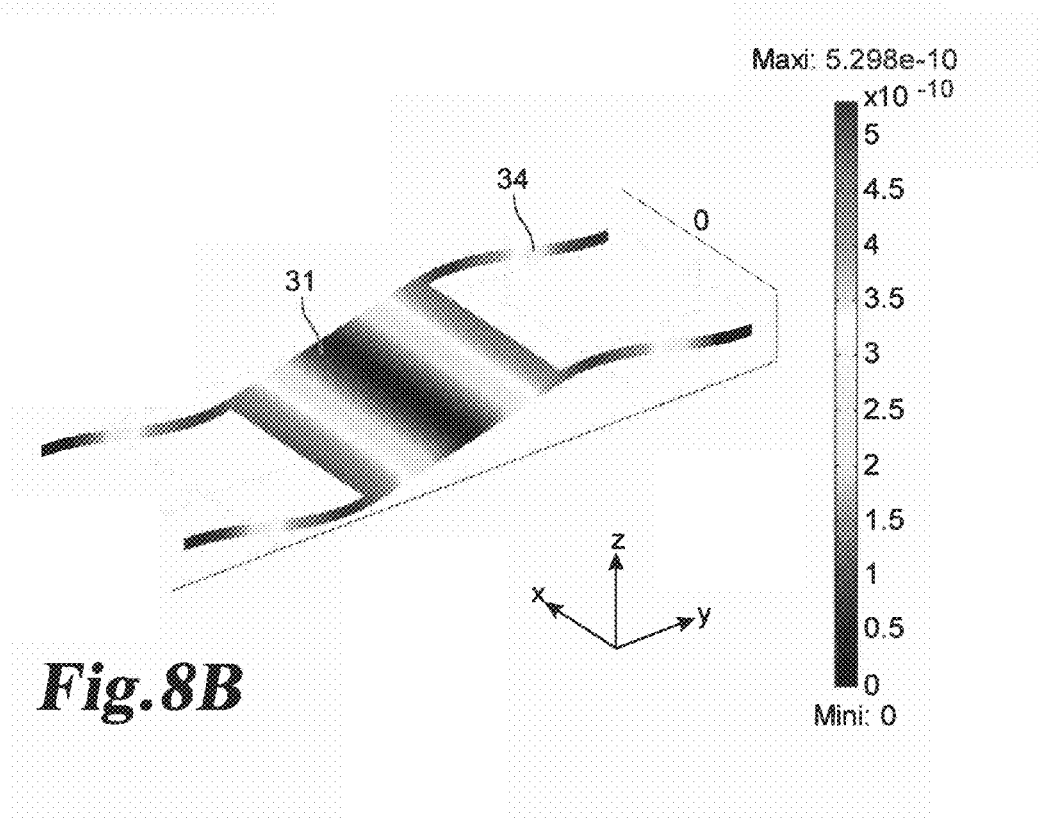
Figure 8C:
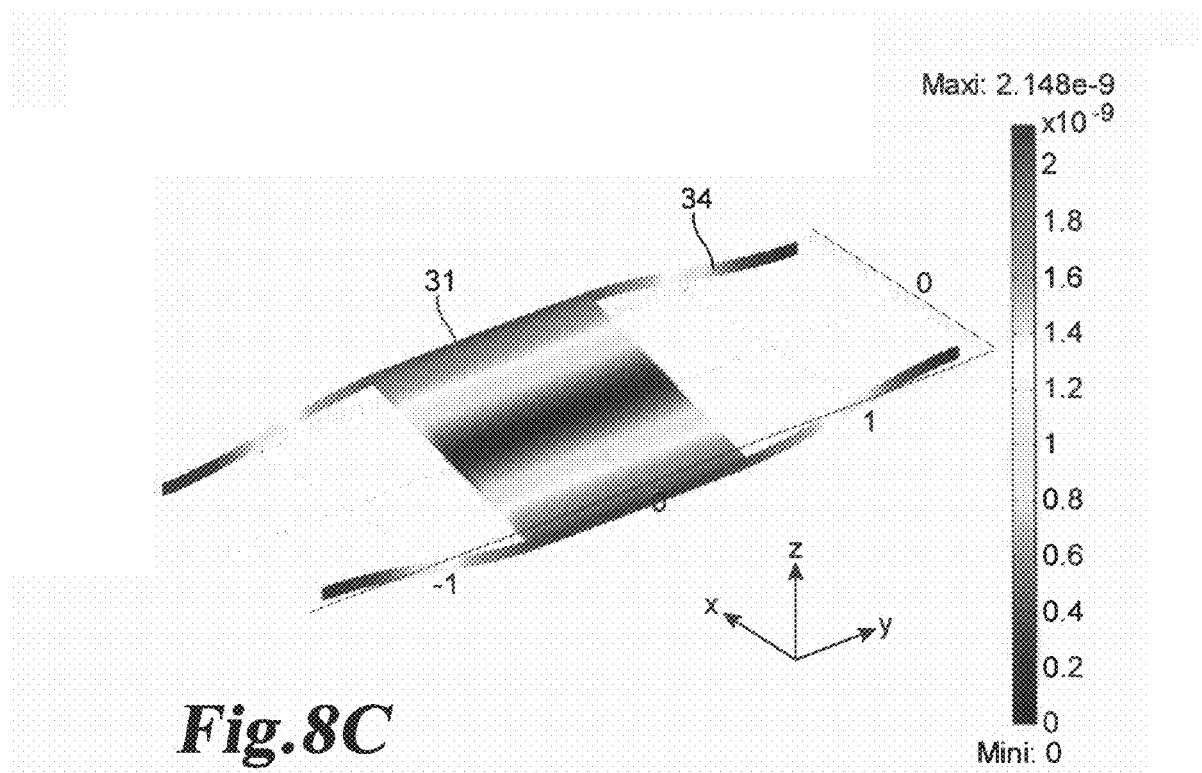

In FIGS. 8B and 8C, the magnetic field is respectively directed according to the axis y and according to the axis x.

It is evident that the arrow called zmax, that is, maximal shifting according to the axis z, of the deformable mass 31 engendered by the torque coming from the combination between the magnetic field and the magnetization of the permanent magnet 32 is very weak when the magnetic field is directed according to the axis y. This arrow is only 0.5 nm in FIG. 8B.

By comparison, this type of sensor has a larger arrow, zmax=2.2 nm, when the magnetic field is directed according to the axis x, as illustrated in FIG. 8C.

In fact, the force F directed according to the axis z is equal to the C/L ratio or represents the torque which is applied to the deformable mass 31 and L is the lever arm between the point of application of the force F and the fixed part, this lever arm depending on the length of the elastic arms 34.

The force F according to the axis z and the torque C which applied to the end of the elastic arms 34 are proportional to the volume of the magnet. If the dimension of the deformable mass 31 is increased according to the axis y, that is, according to the axis of the elastic arms 34, the force F will be all the greater since the lever arm is increased.

Figure 9A:
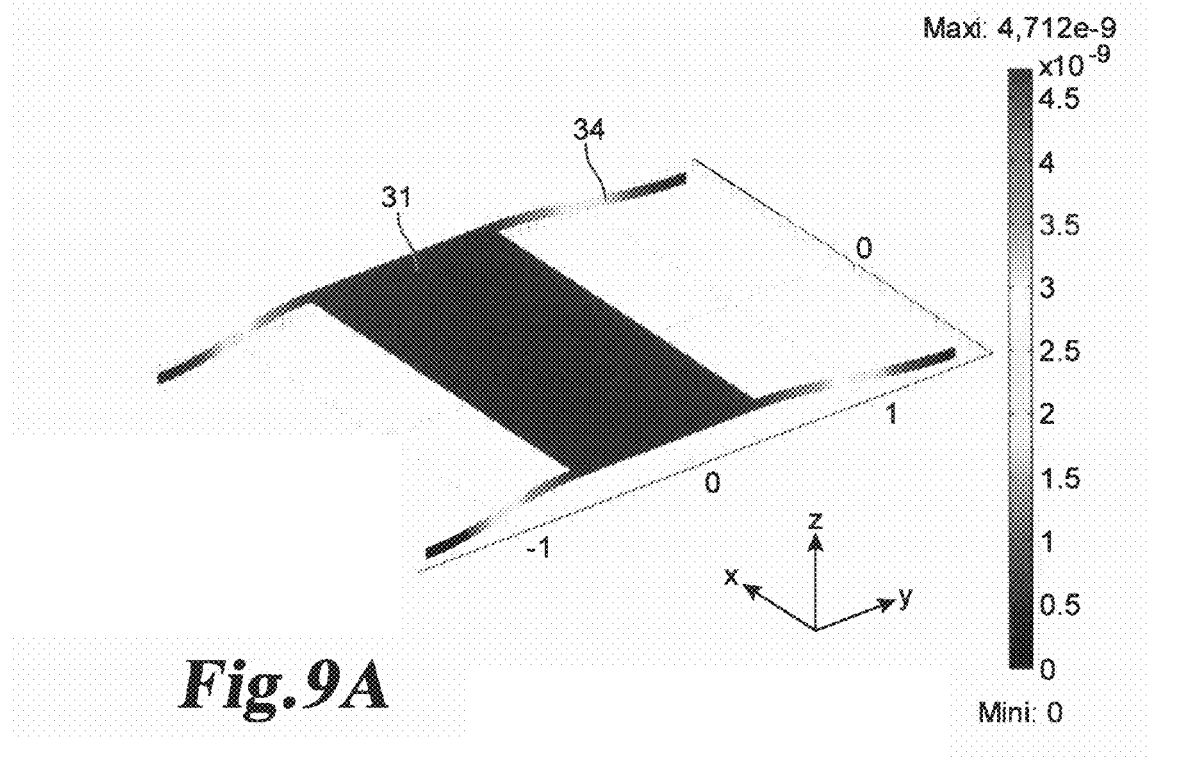
FIGS. 9A, 9B respectively show deformation of a sensor whereof the deformable mass is wider than that shown in FIG. 8, when subjected to a magnetic field gradient of axis z and to a magnetic field of axis x.
Figure 9B:
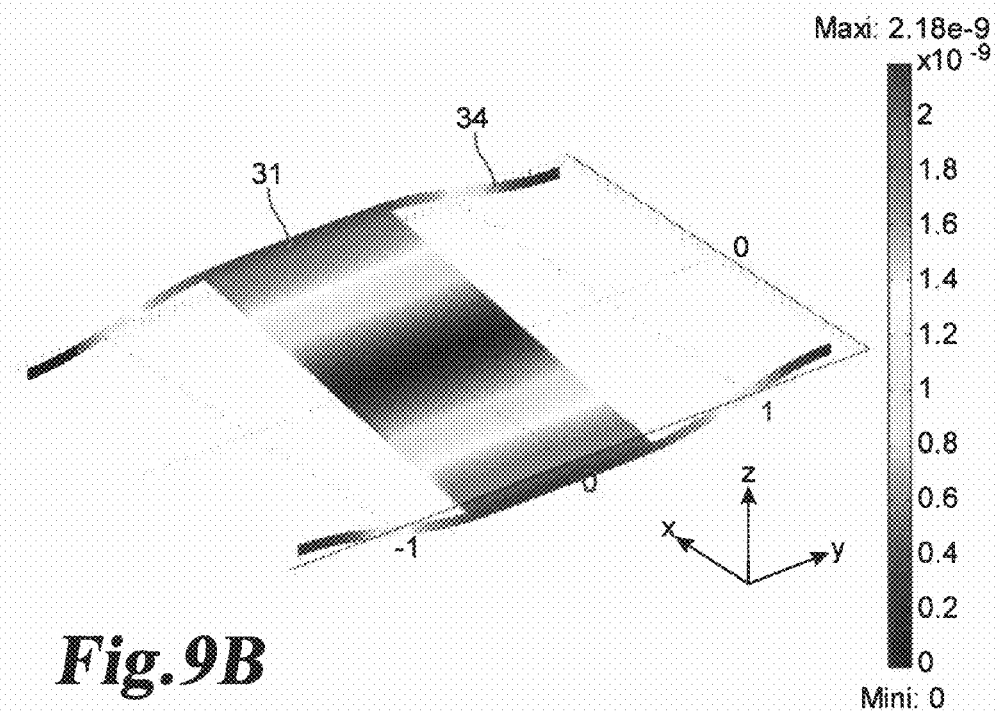

On the contrary, as illustrated in FIGS. 9A and 9B, if the dimension of the deformable mass 31 is increased according to the axis x, that is, transversally to the axis of the elastic arms 34, the force F remains substantially identical but lateral shifting dx is increased, with all the other parameters being unchanged also. In FIGS. 9A, 9B the dimensions of the deformable mass 31 become 200×100×5 cubed micrometers.

In FIG. 9A, lateral displacement dx=4.7 nanometres occurs and in FIG. 9B an arrow zmax of 2.2 nanometres happens when the magnetic field is directed according to the axis x.

Figure 10:
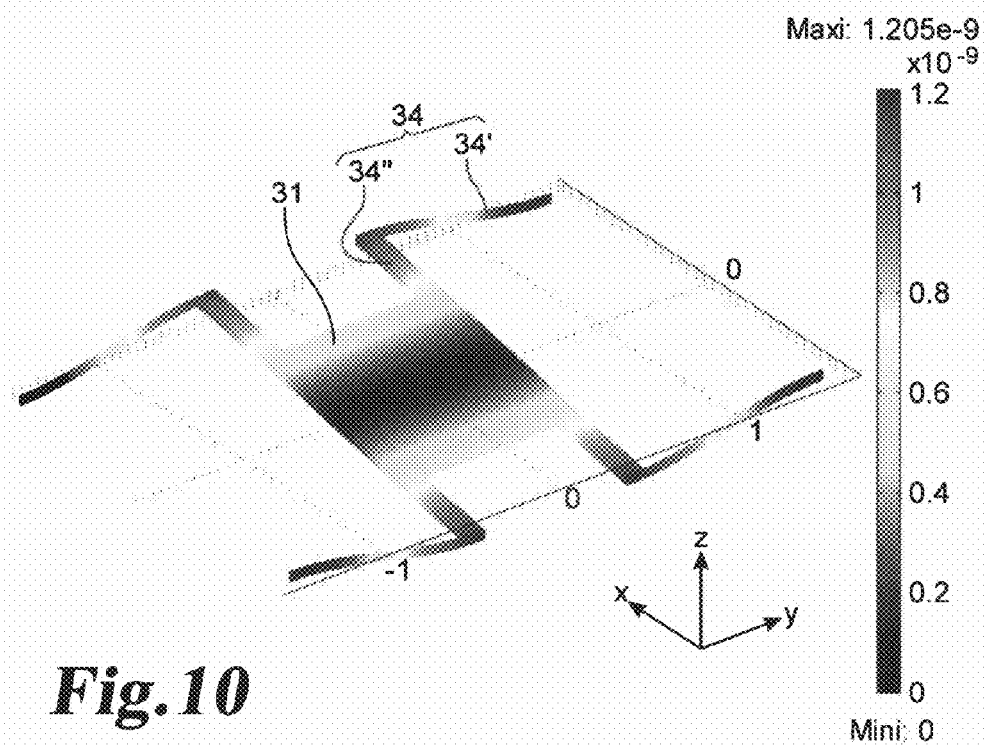
FIG. 10 shows deformation of a sensor similar to that of FIG. 7, when subjected to a magnetic field of axis x.

In FIG. 10, the sensor according to the invention has two pairs of elastic arms 34 whereof the anchoring points in the fixed part 33 are further away than in the two preceding cases illustrated in FIGS. 8 and 9.

The main sections 34' directed according to the axis y of the elastic arms 34 are always 100×1×5 cubed micrometers but these main sections 34' are attached to additional sections 34" oriented substantially according to the axis x. Lateral displacement of the deformable mass 31 is not modified, but this is not illustrated. Two main sections 34' oriented according to the axis y connected to a same side of the fixed part 33 are spaced apart at the level of their anchoring point by 200 micrometers, whereas in the configuration of FIG. 8, this spacing was only 100 micrometers. The aim in FIG. 10 was to show that the maximal arrow zmax obtained with a magnetic field oriented according to the axis x diminished significantly at the level of the point of measuring. It is no more than substantially 0.6 nanometre. Such a configuration makes the sensor according to the invention less sensitive to torque without degrading its sensitivity to the field gradient.

Figure 11A:
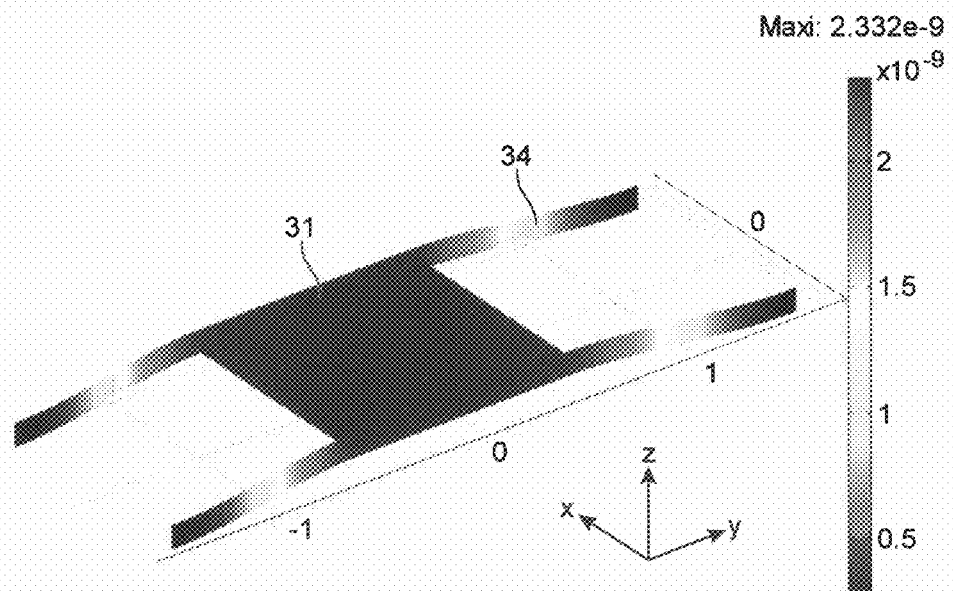
FIGS. 11A, 11B, 11C respectively show deformation of a sensor of FIG. 4 but whereof the deformable mass and the elastic arms are thickened, when it is subjected to a magnetic field gradient of axis z, to a magnetic field of axis y and to a magnetic field of axis x.
Figure 11B:
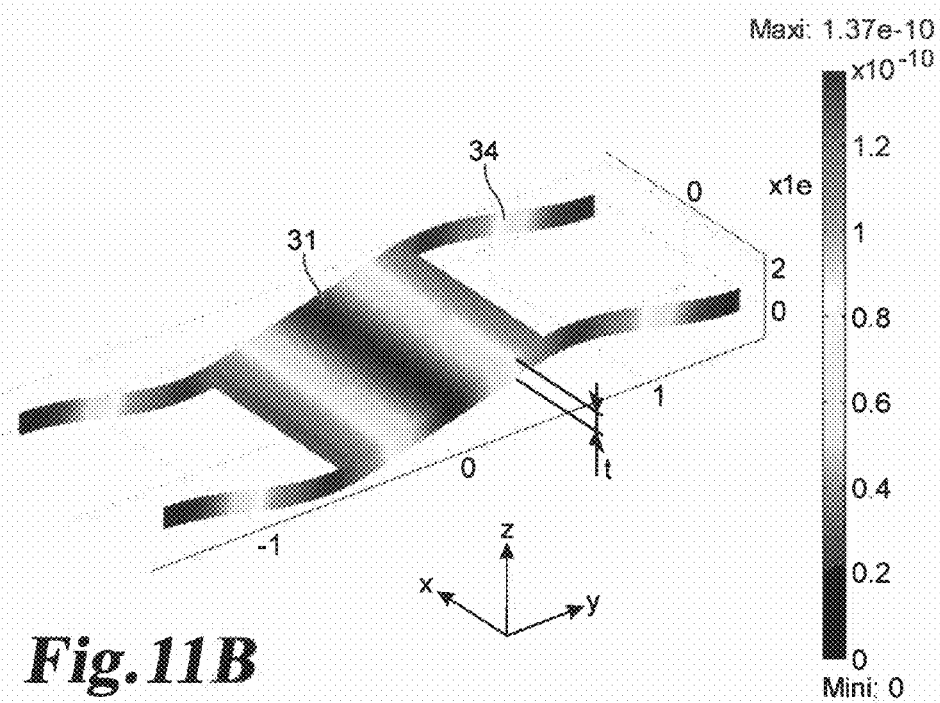
Figure 11C:
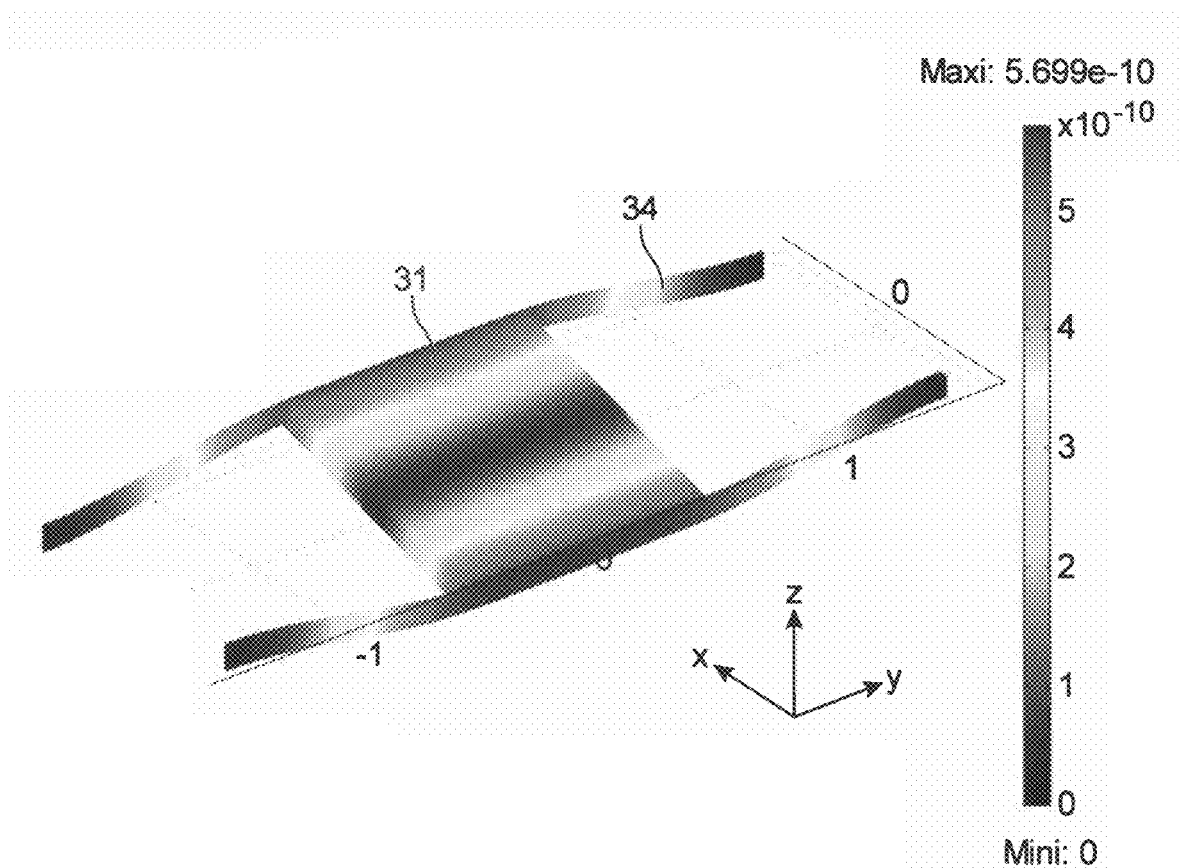

In FIGS. 11A, 11B, 11C, the aim was to show the influence of the thickness of the deformable mass 31 and that of the elastic arms 34.

The thickness t of the elastic arms 34 and of the deformable mass 31 has been doubled, this thickness growing from 5 micrometers to 10 micrometers, while the two other dimensions remain unchanged.

Increasing the thickness t of the elastic arms without touching their width w augments the kz/kx ratio with kz the stiffness according to the axis z of the elastic arms 34 and kx the stiffness according to the axis x, since $kx/kz=(t/w)^2$. The aim is to increase this ratio of the kx/kz stiffnesses as much as possible so that lateral shifting dx due to the magnetic field gradient is the greatest possible relative to the arrow engendered by a magnetic field directed according to the axis x. In conclusion, the deformable mass 31 is made less sensitive to the magnetic field without modifying its sensitivity to the magnetic field gradient. Lateral displacement dx of the deformable mass is always 2.35 nm, then the maximal arrow zmax engendered by a magnetic field oriented according to the axis y is 0.14 nm (FIG. 11B) and that zmax engendered by a magnetic field oriented according to the axis x is only 0.6 nm (FIG. 11C).

The sensor according to the invention can also serve to distinguish contribution due to a magnetic field gradient from that due to acceleration to which the sensor would be subjected. Optionally, the sensor forming the subject matter of the invention can measure the two physical variables at the same time.

Figure 12:
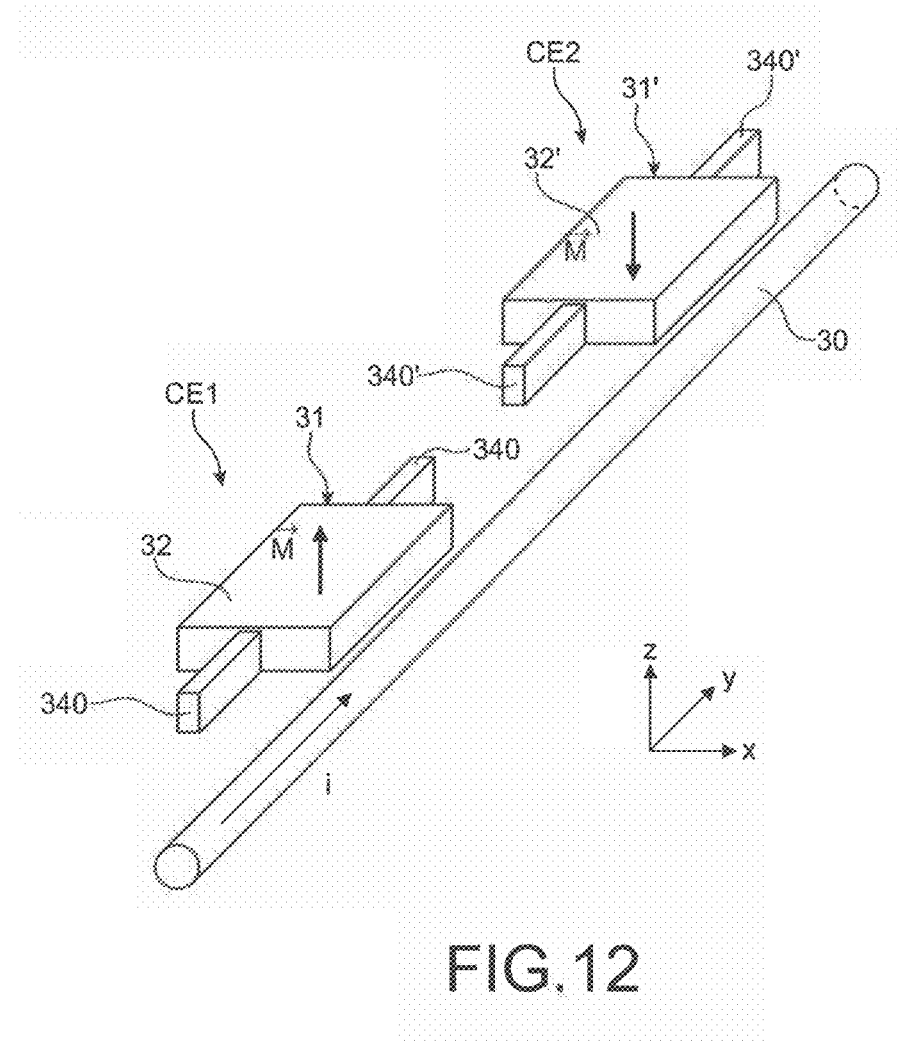
FIG. 12 shows, similarly to FIG. 3, a gradient sensor of a component of a magnetic field able to also measure acceleration.

Reference is made to FIG. 12. In this configuration, the sensor comprises two elementary sensors CE1, CE2 in accordance with those described previously placed end to end (but without contact), and the magnets 32, 32' of the two elementary sensors CE1, CE2 are magnetised in the inverse direction. The forces exerted on the two deformable masses 31, 31' of the two elementary sensors CE1, CE2 will also be in the inverse direction. On the contrary, acceleration creates forces in the same direction on the deformable masses 31, 31'. The sum of the signals delivered by the differential measuring means (not shown) of the two elementary sensors translates acceleration to which the sensor is subjected, while the difference of the two signals translates the magnetic field gradient. An addend and/or subtractor circuit is also provided, which receives the output of the differential measuring means of each of the elementary sensors. This addend and/or subtractor circuit is not shown.

In FIG. 12, the magnetic field gradient is created by circulation of a current in a substantially cylindrical wire conductor 30 directed substantially in the same axis as the elastic arms 340, 340' which suspend the deformable mass 31, 31' of each of the elementary sensors CE1, CE2 relative to the fixed parts (not shown). The two elementary sensors CE1, CE2 are placed in a pair along the axis of the wire conductor 30 (axis y).

Reference will now be made to a production process of a gradient sensor of a component of a magnetic field according to the invention. More particularly, reference is made to an example comprising only a single elementary sensor whereof the deformable mass is fitted with elastic arms and whereof the measuring means of the electric variable translating stress or deformation of the deformable mass engendered by the gradient of the electric variable are differential. More precise explanations will be given for the event where the sensor comprises two elementary sensors with magnets having inverse magnetization directions and for the event where the deformable mass is directly anchored to the support device.

The described previously structure can produce both macroscopic sensors and miniature sensors on a micrometric or nanometric scale. Such miniature sensors can also made using technologies known as SoC or SiP. The first technology cited means System on Chip and the second means System in package.

The starting point is a base substrate 100 comprising a sacrificial layer 101 made of embedded electrically insulating material, that is, sandwiched between two layers of semi-conductor material 102, 103 (FIG. 13A). This can be advantageously a SOI substrate (silicon on insulator). Reference is made to FIG. 13A. Such a substrate 100 comprises two layers of silicon sandwiching an electrically insulating layer.

One or more elementary sensors can be produced on this base substrate 100, as described previously.

The description will be referred to hereinbelow as if only a single elementary sensor were produced. But this poses no problem to extend the different steps described hereinbelow so as to simultaneously make several elementary sensors on the same base substrate 100. Several elementary sensors can remain solid with the same base substrate 100 especially in the case of making a gradient sensor from a component of a magnetic field suitable for measuring acceleration. In other applications, the elementary sensors are dissociated from one another by the base substrate 100 being cut into pieces.

To start with, at least one caisson 104 is hollowed out in one of the layers made of semi-conductor material 103, called the superficial layer, before accepting a magnet of a deformable mass (FIG. 13B). The depth of the caisson 104 is less than the thickness of the superficial layer 103, meaning that the bottom of the caisson 104 is located in the material of the superficial layer 103 made of semi-conductor material and does not reveal the sacrificial layer 101. The caisson 104 can be made by dry etching for example of RIE type (English acronym for Reactive Ion Etching).

The depth of the caisson 104 will be only 4 micrometers, for example, if the thickness of the superficial layer 103 is 5 micrometers.

A sub-layer 105 is deposited on the surface so that it carpets the bottom and the flanks of the caisson 104 (FIG. 13C). The function of this sub-layer 105 is to ensure adhesion of the layer of magnetic material of the future permanent magnet and prevent diffusion of the material semi-conductor in which the caisson in the magnetic material is hollowed out during an optional future step of crystallisation annealing. This sub-barrier layer 105 can be made based on tantalum Ta, tungsten W, tungsten nitride and can be deposited by physical deposit in vapour phase, known by the English acronym PVD for Physical Vapor Deposition.

Each permanent magnet is then made. For this to happen, a layer of magnetic material 106, for example a neodymium iron boron alloy, samarium cobalt or any alloy of rare earths and transition metals having properties of hard magnetic materials (FIG. 13D) is deposited on the surface. This deposit of magnetic material can be done by PVD deposition. The layer of magnetic material 106 is sufficiently thick to fill the caisson 104. The layer of magnetic material 106 can have a thickness of around 5 micrometers. Instead of carrying out PVD deposition, it is possible to employ electrolytic deposition with alloys of cobalt platinum type, for example.

The next step is mechanical chemical polishing of the layer of magnetic material 106 which surface stop of the superficial layer made of semi-conductor material 103. The magnetic material is retained in each caisson 104.

The whole is covered by a passivation layer 107, for example by PVD. This passivation layer 107 can be made from a base made of a tantalum base Ta, tungsten W, or tungsten nitride. A lithography step followed by dry or wet etching is used to retain this passivation layer 107 above the magnet 32, and it is eliminated elsewhere (FIG. 13E). It can of course make it slightly exceed the contour of the magnet.

The next step is magnetising of the magnet 32. It is preferable to provide a preceding annealing step of the magnetic material 106 so as to crystallise the magnetic material in the event where the layer of magnetic material 106 is amorphous or magnetically soft after deposition. Annealing can be done at around 750° C. for ten minutes under vacuum for neodymium iron boron alloys. Later magnetising can be completed by exposure to an intense magnetic field of for example several Teslas delivered by an electromagnet or a supraconductive bobbin (not shown).

Electric contacts for the fixed parts 33 and the measuring means of the electric variable translating stress or shifting 35 will then be made. The electric contacts of the measuring means 35 are referenced 108 and those of the fixed parts 33 are 108'. In the example described, the fixed parts 33 are earthed. It is assumed in this example that the measuring means are differential measuring means, that they are of capacitive type and are formed from at least one pair of opposite electrodes on either side of the deformable mass. Delimitation of these elements has not yet taken place at this stage. For this, a layer of electrically conductive material, such as aluminium silicide AlSi, is surface-deposited. An etching step, for example chemical etching, is used to delimit the contour of the electric contacts 108 (FIG. 13F).

The contour of the deformable mass 31 and of the anchoring points of the deformable mass on the support device, of the elastic arms 34 if they exist, of the support device 33, will then be delimited. The measuring electrodes 35.1, 35.2 of lateral deformation of the deformable mass 31, if they exist, are also delimited.

Figure 14:
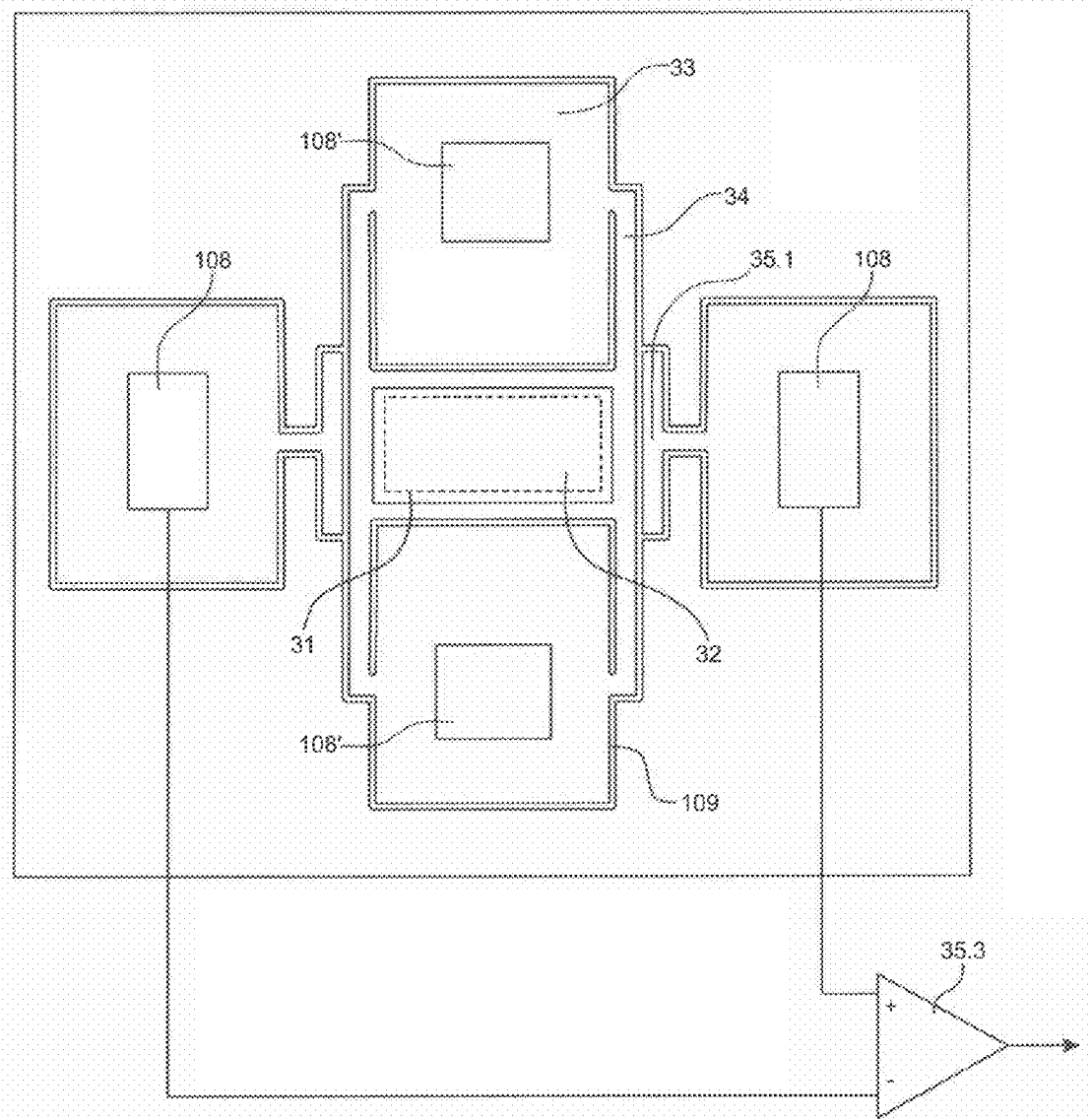
FIG. 14 shows in plan view a sensor made by the process of the invention.

At least one trench 109 on the contour of these elements in the layer of superficial semi-conductor material 103 will be hollowed out. This trench 109 can be made by dry etching DRIE (English acronym for Deep Reactive Ion Etching) that is, deep reactive ion etching. The bottom of the trench 109 stops at the insulating layer 101 of the base substrate (FIG. 13F). The trench 109 is clearly visible in FIG. 14.

The deformable mass 31 and the undersides of the electrodes 35.1, 35.2 and elastic arms 34 will then be released, but not the anchoring to the support devices 33 and the support device 33 itself. This releasing is done by eliminating the embedded sacrificial material 101 located under the deformable mass 31, the elastic arms 34 and the electrodes 35.1, 35.2 (if they exist) (FIG. 13G). The sacrificial layer 101 is also left. This can be done by wet etching in fluorhydric acid. It remains only to connect the electric contacts 108 of the measuring means of the electric variable translating stress or deformation of the deformable mass engendered by the gradient of the electric variable to a differential amplifier 35.3 sketched in FIG. 14.

If a gradient sensor is made suitable for also measuring acceleration as illustrated in FIG. 12, since the two permanent magnets of the two elementary sensors have opposite magnetising directions, it is no longer possible to provide a magnetising step by exposure to the same intense magnetic field as described previously. By comparison, a thermally assisted magnetic writing step can be employed. This concept is described, studied and realised in document [6].

Even though several embodiments of the present invention have been illustrated and described in detail, it will be understood that different changes and modifications might be made without departing from the scope of the invention.

The different variants described must be understood as not being mandatorily exclusive from one another.

Documents Cited

[1] U.S. Pat. No. 3,829,768

[2] "Induction coil sensors—a review" S. Tumanski, Measurement Science and Technology, vol. 18, R 31-46, 2007

[3] "Magnetic gradiometry: a new method for magnetic gradient measurement" A. Veryaskin, Sensors and Actuators, vol 91, pages 233-235, 2001

[4] "Fiber-optic magnetic gradiometer utilizing the magnetic translational force" H. Okamura, Journal of Lightwave Technology, vol 8(6), pages 877-882, 1990

[5] "Design of a MEMS passive, proximity-based AC electric current sensor for residential and commercial loads" E. The land et al., PowerMEMS 2007, Berkeley, Calif.

[6] "Thermomagnetic writing in Tb-Fe: Modeling and comparison with experiment" J. C. Suits et al., Journal of Applied Physics, vol 64(1), pages 252-261, 1988.

The invention claimed is:

1. A gradient sensor of a component of a magnetic field comprising at least one elementary sensor comprising
a deformable mass equipped with a permanent magnet having a magnetization direction substantially colinear to the direction of the gradient of the component of the magnetic field to be acquired by the sensor,
wherein the deformable mass is able to deform under the effect of a force exerted on the magnet by the gradient, the effect of said force being to shift it, by dragging the deformable mass, in a direction substantially colinear to the component of the magnetic field for which the sensor has to acquire the gradient, the deformable mass comprising at least two anchoring points to a fixed support device, the at least two anchoring points being located in two opposite zones of the deformable mass and the permanent magnet being located between two anchoring points, and
the elementary sensor also comprising measuring means of at least one electric variable translating deformation or stress of the deformable mass engendered by the gradient.

2. The sensor as claimed in claim 1, wherein an anchoring point of the deformable mass is connected directly to the support device.

3. The sensor as claimed in claim 1, comprising two elementary sensors in which the magnets of the deformable masses have magnetization directions opposed so as to be able to distinguish acceleration of the gradient of the magnetic field component and optionally measure acceleration and gradient at the same time.

4. The sensor as claimed in claim 1, wherein the deformable mass is anchored to the support device at the level of one or more zones of its periphery or over its entire periphery.

5. The sensor as claimed in claim 1, wherein the permanent magnet is located horizontally between the two anchoring points.

6. The sensor as claimed in claim 1, wherein the deformable mass extends at rest substantially in a plane and wherein the magnetising direction of the permanent magnet is substantially normal to the plane.

7. The sensor as claimed in claim 6, wherein an anchoring point of the deformable mass is connected indirectly by means of an elastic arm.

8. The sensor as claimed in claim 7, wherein the deformable mass is suspended relative to the support device by means of at least two elastic arms directed substantially in the plane of the deformable mass.

9. The sensor as claimed in claim 8, wherein the elastic arms comprise at least one main section.

10. The sensor as claimed in claim 8, wherein two elastic arms forming a pair have main sections located in the extension of one another.

11. The sensor as claimed in claim 10, wherein the magnet is shifted according to an axis of the plane, substantially normal to the axis of the main sections.

12. The sensor as claimed in claim 8, wherein when the elementary sensor comprises two pairs of elastic arms, the anchoring points of the deformable mass to which are connected two elastic arms not belonging to the same pair are as far away as possible.

13. The sensor as claimed in claim 8, wherein when the elementary sensor comprises two pairs of elastic arms, the anchoring points of the deformable mass to which are connected the elastic arms of the two pairs are placed symmetrically relative to an axis of symmetry of the deformable mass.

14. The sensor as claimed in claim 8, wherein the elastic arms have a thickness and a width, their thickness being greater than their width to be more rigid according to directions substantially orthogonal to the direction of the force exerted on the magnet by the gradient.

15. The sensor as claimed in claim 9, wherein each elastic arm comprises an additional section connected to the main section and arranged in such a way that two adjacent anchoring points of the deformable mass to which are connected two elastic arms of different pairs are less distant than anchoring points to which are connected said elastic arms on the support device.

16. The sensor as claimed in claim 9, wherein when the elementary sensor comprises a single pair of elastic arms, the axis of the main sections of the elastic arms is merged with an axis of symmetry of the deformable mass.

17. The sensor as claimed in claim 1, wherein the measuring means of at least one electric variable translating the deformation or the stress of the deformable mass engendered by the gradient are differential.

18. The sensor as claimed in claim 17, wherein the differential measuring means are capacitive or comprise at least one pair of strain gauges.

19. The sensor as claimed in claim 1, further comprising excitation means of the deformable mass to make it vibrate, these excitation means being especially electrostatic, piezoelectric or magnetic.

20. The sensor as claimed in claim 19, wherein the deformable mass exhibits a deformation which is non linear as a function of the force applied to the magnet due to the gradient.

* * * * *